(12) United States Patent
Anno et al.

(10) Patent No.: US 11,686,785 B2
(45) Date of Patent: Jun. 27, 2023

(54) MAGNETIC FIELD GENERATOR AND MAGNETIC SENSOR HAVING THE SAME

(71) Applicant: DENSO CORPORATION, Kariya (JP)

(72) Inventors: Yuki Anno, Kariya (JP); Takayuki Shibata, Nisshin (JP); Kazuhiro Oyama, Nisshin (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/675,109

(22) Filed: Feb. 18, 2022

(65) Prior Publication Data

US 2022/0268859 A1 Aug. 25, 2022

(30) Foreign Application Priority Data

Feb. 23, 2021 (JP) .................................. 2021-026889

(51) Int. Cl.
*G01R 33/032* (2006.01)
*H01F 7/20* (2006.01)

(52) U.S. Cl.
CPC ............. *G01R 33/032* (2013.01); *H01F 7/20* (2013.01)

(58) Field of Classification Search
CPC .............. G01R 33/032; G01R 33/0017; G01R 33/0023; G01R 33/26; H01F 7/20; H01F 2007/068

See application file for complete search history.

(56) References Cited

U.S. PATENT DOCUMENTS

2019/0079157 A1* 3/2019 Yoshii ................ G01R 33/1284

FOREIGN PATENT DOCUMENTS

JP 2008-002933 A 1/2008

* cited by examiner

*Primary Examiner* — Jay Patidar
(74) *Attorney, Agent, or Firm* — Posz Law Group, PLC

(57) ABSTRACT

A magnetic field generator includes: an upper layer coil composed of a first conductive material and forming a loop circuit having a coil portion; a lower layer coil composed of a second conductive material and forming a loop circuit having a coil portion arranged opposite to the coil portion of the upper layer coil at a predetermined distance; and a substrate supporting the upper layer coil and the lower layer coil and having a dielectric material between the upper layer coil and the lower layer coil. High-frequency currents of opposite phases are passed through the upper layer coil and the lower layer coil, respectively, and a length per loop of the coil portion in the upper layer coil and the coil portion in the lower layer coil is matched to one wavelength of the high-frequency current.

13 Claims, 25 Drawing Sheets

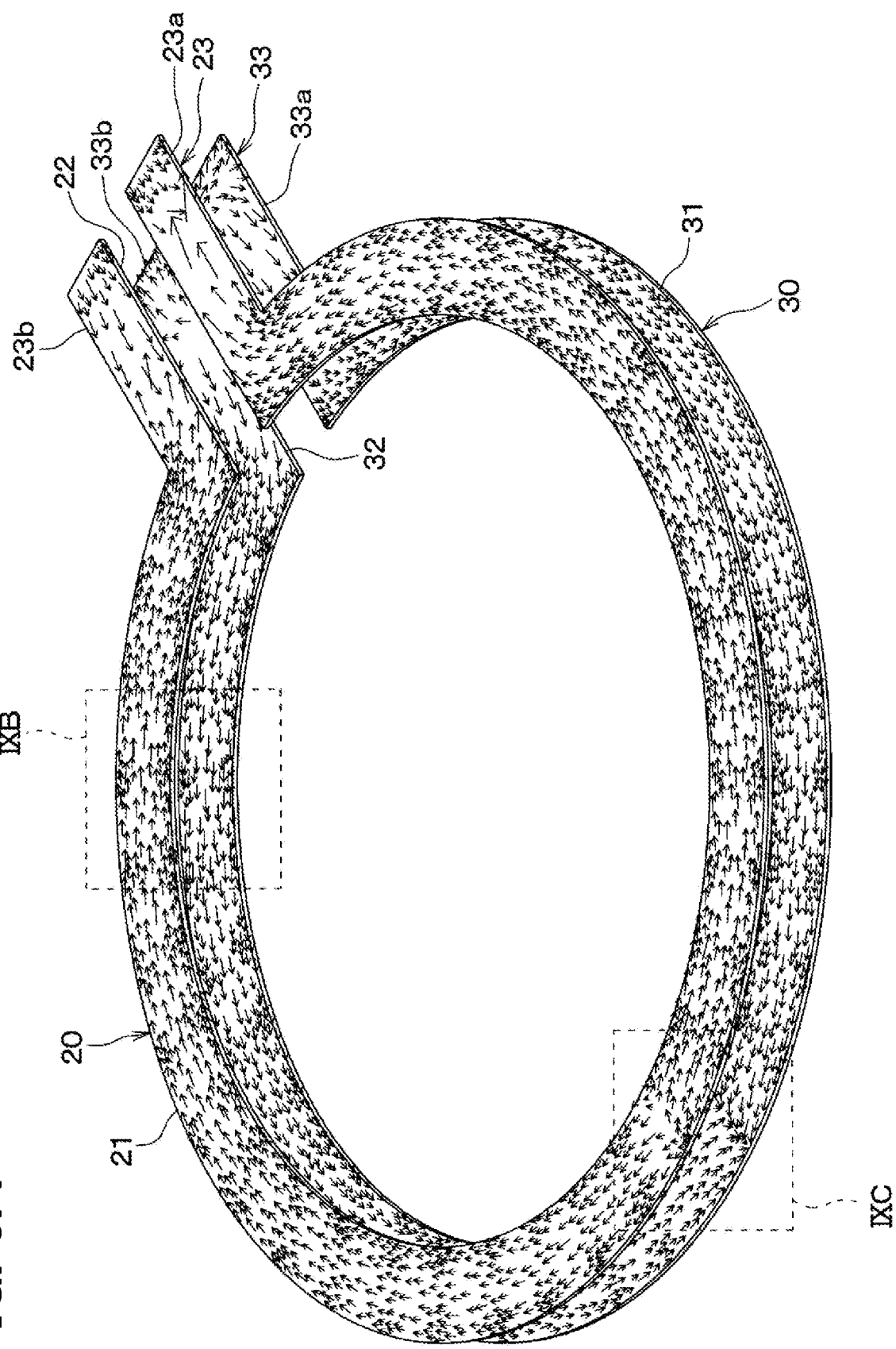

MAGNETIC FIELD GENERATOR AND MAGNETIC SENSOR HAVING THE SAME

CROSS REFERENCE TO RELATED APPLICATION

The present application is based on and claims the benefit of priority of Japanese Patent Application No. 2021-026889, filed on Feb. 23, 2021, the disclosure of which is incorporated herein by reference.

TECHNICAL FIELD

The present disclosure generally relates to a magnetic field generator and a magnetic sensor including the magnetic field generator.

BACKGROUND

For comparison, a prior art discloses a loop gap resonator corresponding to a magnetic field generator that generates a high-frequency magnetic field in an axial direction of a coil. In the loop gap resonator, an electric field of the same path is generated in the entire circumferential direction of the loop-shaped electrode, in other words, the cylindrical shape electrode. That is, a magnetic field is generated in a path that extends from an inside of the cylinder formed by the electrode to an outside of the cylinder at one end of the cylinder in the axial direction, and the magnetic field is further guided to an other end of the cylinder along an outer peripheral surface of the cylinder, and the magnetic field returns to the inside of the cylinder. Therefore, a high-frequency magnetic field is generated in the axial direction of the coil, passing through the inside of the cylindrical coil formed by the electrode.

It is desired to detect a very small external magnetic field, thus it is necessary to bring the source of the magnetic field and the magnetic sensor closer to each other. If the sensor is a cylindrical loop gap resonator, it is necessary to bring a detection target closer to an inside of the cylinder. However, since there are loop coils, resonators, and a substrate on which they are disposed on the XY plane, there may be a certain limit of how much the resonator, i.e., the cylinder, and the detection target can be brought close to each other.

On the other hand, if the source of the external magnetic field is placed directly above or below the cylinder-shape magnetic field generator, that is, at one of the two proximate positions in the axial direction, the distance between the two becomes short, but the external magnetic field cannot be measured because the loop gap resonator has no sensitivity in the axial direction. In order to create sensitivity in the axial direction, it is necessary to generate a high-frequency magnetic field in the XY plane.

SUMMARY

It is an object of the present disclosure to provide a magnetic field generator capable of generating a high-frequency magnetic field in an XY plane, when an axial direction of a coil is set as a Z axis, and a plane perpendicular to the Z axis is set as an XY plane, and to also provide a magnetic sensor having such a magnetic field generator.

BRIEF DESCRIPTION OF DRAWINGS

FIG. 9A is a diagram showing directions of electric currents flowing through the upper layer coil and the lower layer coil by simulation with arrows;

DETAILED DESCRIPTION

Hereinafter, embodiments of the present disclosure will be described with reference to the drawings. In the following embodiments, the same or equivalent parts are denoted by the same reference signs.

First Embodiment

Figure 1:
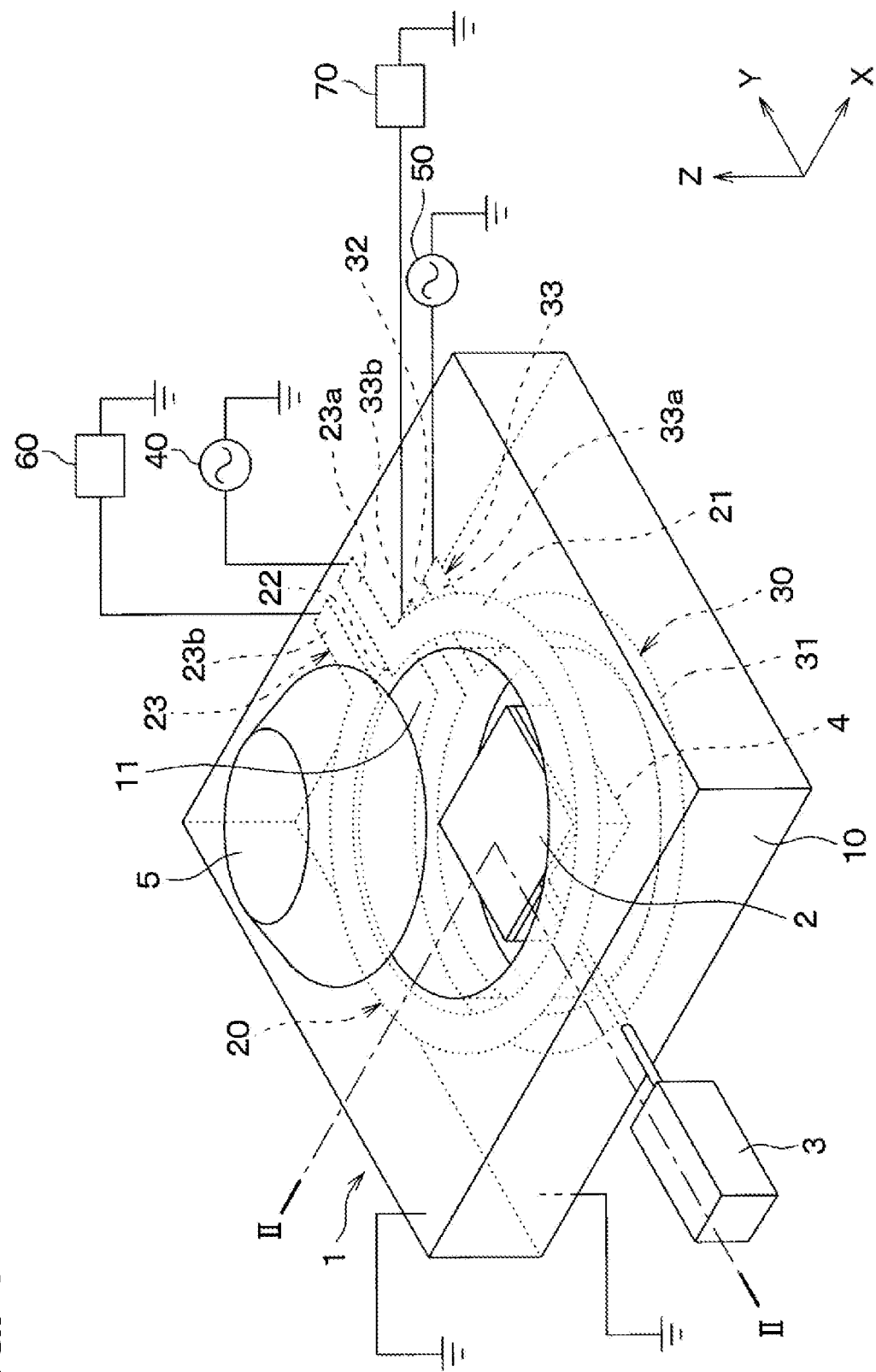
FIG. 1 is an overall configuration diagram of a magnetic sensor provided with a magnetic field generator according to a first embodiment.

The following describes a first embodiment. In the present embodiment, a magnetic sensor provided with a magnetic field generator is described. The magnetic sensor measures, i.e., detects, an external magnetic field based on a high-frequency magnetic field generated by the magnetic field generator. As shown in FIG. 1, the magnetic sensor is configured to include a diamond 2, a light source 3, a temperature control unit 4, a measurement unit 5, and the like in addition to a magnetic field generator 1.

Figure 2:
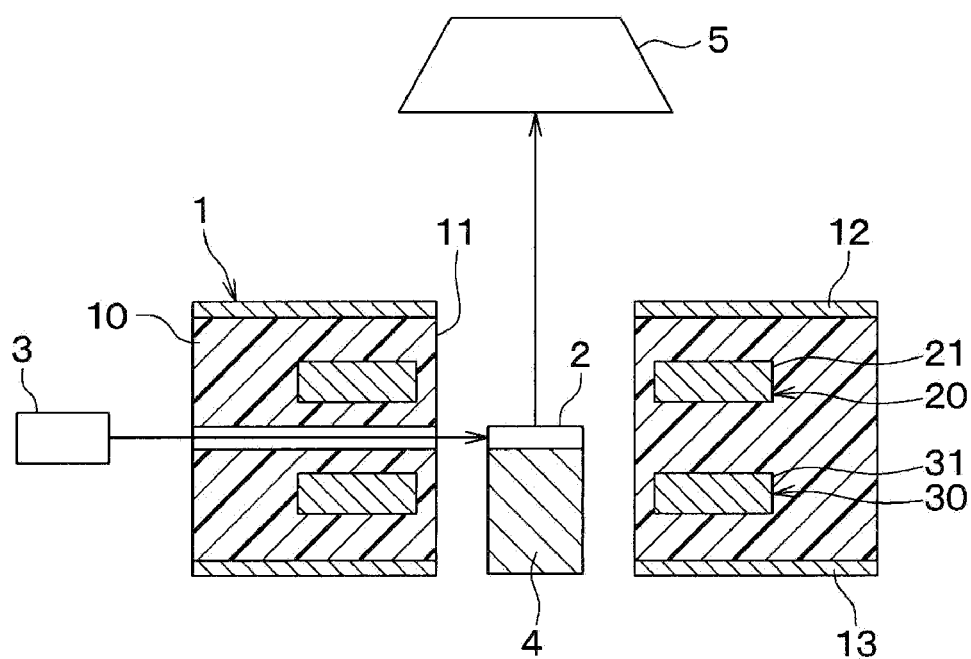
FIG. 2 is a diagram showing a cross-sectional view taken along a line II-II of FIG. 1.
Figure 3:
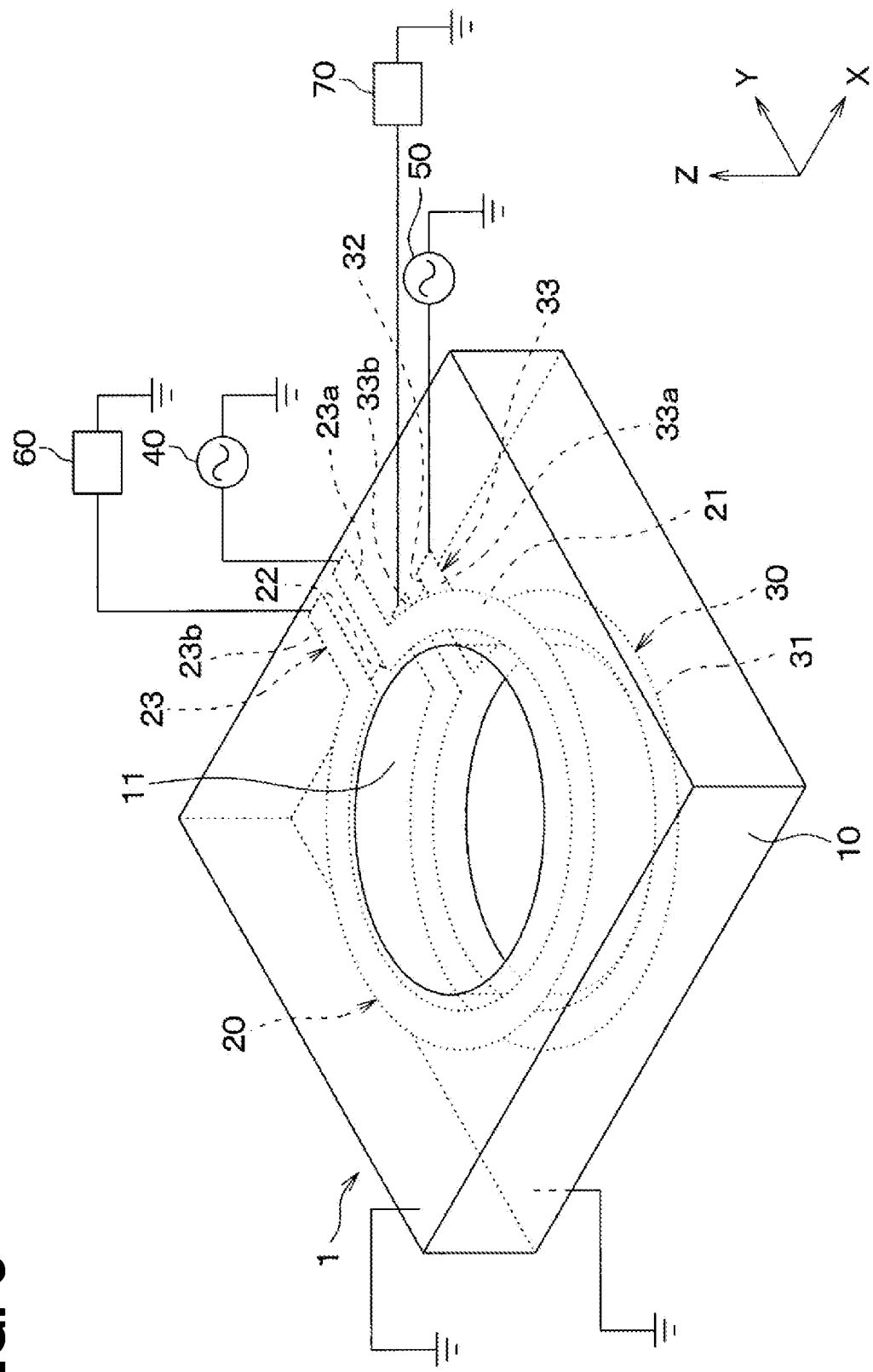
FIG. 3 is a diagram showing the magnetic field generator extracted from FIG. 1.

As shown in FIGS. 1 to 3, the magnetic field generator 1 is configured by arranging two loop-shaped, upper layer coil 20 and lower layer coil 30 on a substrate 10 in an overlapping, layered manner. In the drawing, an XY plane is a plane parallel to a surface (e.g., an upper surface) of the substrate 10, and a normal direction with respect to the XY plane is a direction parallel to the Z axis. Further, the magnetic field generator 1 is provided with an upper layer power source 40 which is a mechanism for energizing the upper layer coil 20 and a lower layer power source 50 which is a mechanism for energizing the lower layer coil 30.

The substrate 10 supports the upper layer coil 20 and the lower layer coil 30. For example, the substrate 10 is made of an epoxy-based resin material or the like, and has a structure including the upper layer coil 20 and the lower layer coil 30 inside. A dielectric composed of a part of the substrate 10 is sandwiched between the upper layer coil 20 and the lower layer coil 30.

Here, the substrate 10 is provided as a multi-layer substrate, which has the upper layer coil 20 and the lower layer coil 30 built therein, by layering and combining a plurality of printed circuit boards. For example, a plurality of printed circuit boards respectively having front and back surfaces covered with a metal foil such as copper foil are prepared, some of which are patterned by etching to form the upper layer coil 20, the lower layer coil 30 and the like. Then, the printed circuit boards after patterning are combined/integrated by press processing or the like to form the substrate 10 which has the upper layer coil 20 and the lower layer coil 30 built therein.

Further, as shown in FIGS. 1 to 3, the substrate 10 is formed with a through hole 11 piercing through an inside of the upper layer coil 20 and the lower layer coil 30. The through hole 11 may be formed so as to penetrate the front and back surfaces of the substrate 10, which in this case has a cylindrical shape. The diamond 2 and the temperature control unit 4, which is described later, are arranged in the through hole 11.

Note that, although omitted in FIGS. 1 and 3, the upper layer coil 20 and the lower layer coil 30 are, as shown in FIG. 2, sandwiched between the front and back surfaces of the substrate 10 and an upper GND layer 12 and a lower GND layer 13 having a ground potential are symmetrically arranged (hereinafter "ground" may be designated as GND). In such manner, a microstrip line is configured by arranging the upper GND layer 12 and the lower GND layer 13 vertically symmetrically on the substrate 10. The upper GND layer 12 and the lower GND layer 13 are formed to cover at least a coil portion 21 of the upper layer coil 20 and a coil portion 31 of the lower layer coil 30. Then, the upper GND layer 12 is partially removed, for example, at a position outside the coil portion 21 and the coil portion 31, and, via the removed portion, an electrical connection between the upper layer power source 40 and the upper layer coil 20 and an electrical connection between the lower layer power source 50 and the lower layer coil 30 are respectively enabled. Further, the through hole 11 is formed to penetrate the upper GND layer 12 and the lower GND layer 13.

The upper layer coil 20 has the coil portion 21, a slit 22 that partially cuts out the coil portion 21, and a lead portion 23 that is arranged on both sides of the slit 22 and is drawn out in an outer peripheral direction of the coil portion 21. The coil portion 21 and the lead portion 23 are made of a first conductive material, such as copper or the like as described above, for example.

The coil portion 21 constitutes a loop circuit composed of a loop-shaped coil. Specifically, the coil portion 21 has an annular shape having a predetermined width, and the length per loop, that is, an electric length of one loop, is set to one wavelength of the high-frequency current flowing from the upper layer power source 40. That is, a distributed constant circuit is configured such that one wavelength of the high-frequency current and the electric length are set to be about the same. When a high-frequency current near 2.87 GHz is used, one wavelength is approximately 100 mm. Therefore, the radius of the coil portion 21 is approximately 16 mm.

However, since a wavelength shortening rate changes according to the material around the coil, that is, the dielectric constant of the substrate 10, the electric length per loop of the coil portion 21 can be set according to the wavelength shortening rate. For example, when FR4 composed of glass epoxy is used as an epoxy-based resin material, the dielectric constant is about 4, which makes the radius about 8 mm due to the wavelength shortening rate, and the length of one loop of the coil portion 21 is set to be approximately 50 mm.

Figure 4A:
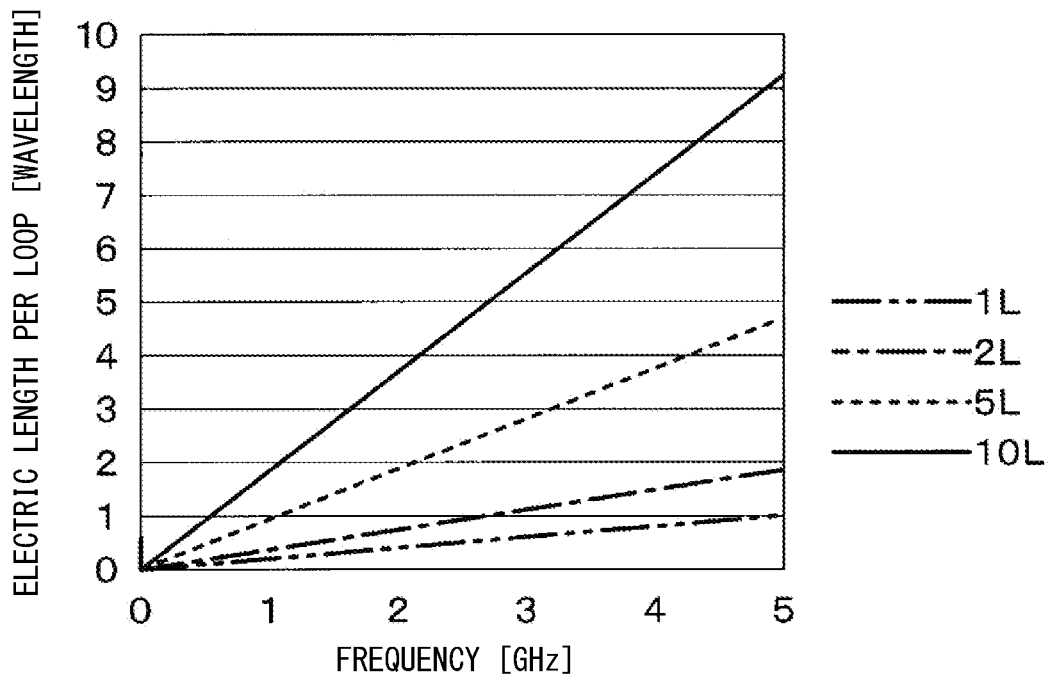
FIG. 4A is a diagram showing a relationship between a physical length and an electric length of a wiring of a loop circuit when a dielectric constant of a substrate is same.
Figure 4B:
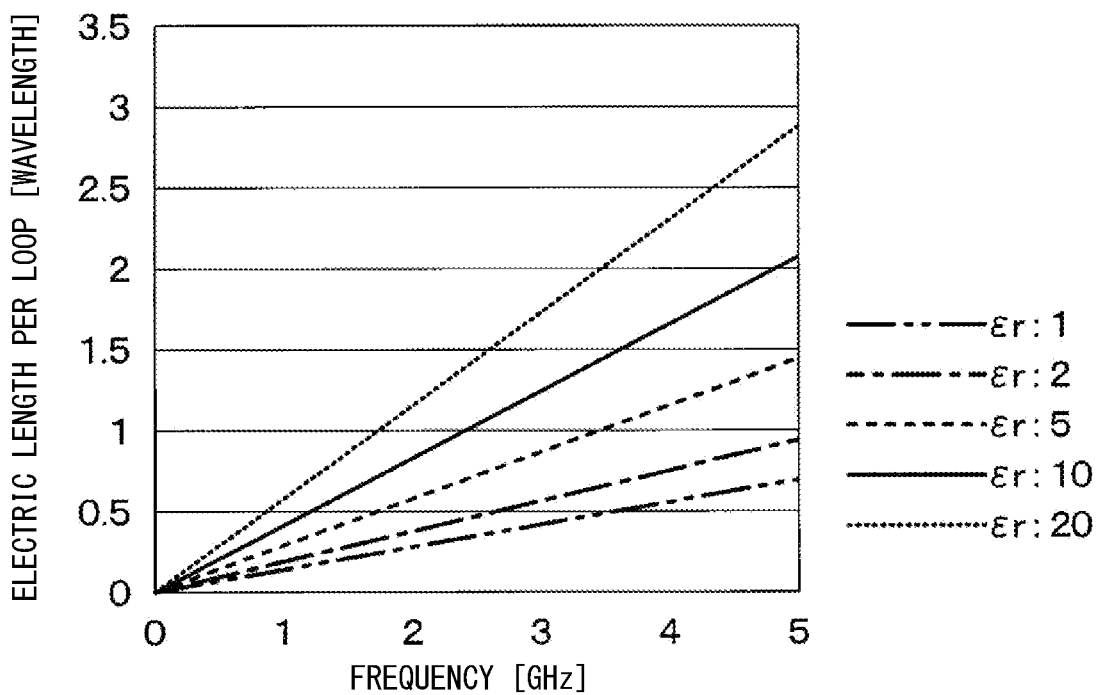
FIG. 4B is a diagram showing a relationship between the dielectric constant and the electric length of the substrate when the physical length of the wiring of the loop circuit is the same.

Generally, the relationship between the physical length and the electric length of the wiring of the loop circuit when the dielectric constant of the substrate is same is shown in FIG. 4A. In FIG. 4A, L means a reference length, and 1L, 2L, 5L, and 10L mean a length obtained by multiplying the reference length by a numerical magnification. Further, the relationship between the dielectric constant and the electric length of the substrate when the physical length of the wiring of the loop circuit is same is shown in FIG. 4B. In FIG. 4B, εr means a relative permittivity, εr: 1, εr: 2, εr: 5, εr: 10, and εr: 20 mean numerical values of the relative permittivity. As shown in these drawings, the electric length in the loop is proportional to the physical length, and the higher the dielectric constant, the longer the electric length. Therefore, in the present embodiment, the electric length per loop of the coil portion 21 composed of the loop coil is set based on the physical length of the upper layer coil 20 corresponding to the wiring and the relative permittivity of the substrate 10.

The length of one loop of the coil portion 21 and one wavelength of the high-frequency current do not have to completely match. That is, if the XY plane can be oriented in the magnetic field direction as described later in generating the high-frequency magnetic field, the length of one loop of the coil portion 21 and one wavelength of the high-frequency current may be different from each other. For example, a magnetic field is generated on the XY plane even if a deviation of ±20% occurs, but it may preferably be within ±10%. Further, the through hole 11 described above has a dimension corresponding to the dimension of the coil portion 21, and, if the radius of the coil portion 21 is approximately 16 mm, the radius is set to be less than that.

The slit 22 is a gap provided between one end and the other end of the coil portion 21, which may be several of one tenth mm to several mm, for example, and the length of one loop of the coil portion 21 excluding such gap is set to be the wavelength of a high-frequency current.

The lead portion 23 has a first lead portion 23a and a second lead portion 23b drawn from one end of the coil portion 21, and the first lead portion 23a is connected to the upper layer power source 40, and the second lead portion 23b is connected to the GND. As a result, a path of electric current is formed in which the electric current flowing from the upper layer power source 40 flows from the first lead portion 23a to the second lead portion 23b through the coil portion 21. Further, in order to suppress a reflection of the electric current flowing from the second lead portion 23b to the GND, a resistor 60 is provided at a position between the second lead portion 23b and the GND.

The lower layer coil 30 has a shape corresponding to the upper layer coil 20. The lower layer coil 30 also has the coil portion 31, a slit 32 that partially cuts out the coil portion 31, and a lead portion 33 that is arranged on both sides of the slit 32 and is drawn out/extends in the outer peripheral direction of the coil portion 31. The coil portion 31 and the lead portion 33 are made of a second conductive material, such as copper or the like as described above, for example.

The coil portion 31 constitutes a loop circuit composed of a loop-shaped coil. Specifically, the coil portion 31 is formed in the same shape and dimensions as the coil portion 21 of the upper layer coil 20, and is arranged to face the coil portion 21 at a predetermined distance.

The slit 32 also has the same dimensions as the slit 22 of the upper layer coil 20. In the present embodiment, the slit 32 is formed at the same position as the slit 22.

The lead portion 33 has a first lead portion 33a and a second lead portion 33b drawn from one end of the coil portion 31, and the first lead portion 33a is connected to the lower layer power source 50, and the second lead portion 33b is connected to the GND. In such manner, a path of electric current is formed in which the electric current flowing from the lower layer power source 50 flows from the first lead portion 33a to the second lead portion 33b via the coil portion 31. Further, in order to suppress a reflection of the electric current flowing from the second lead portion 33b to the GND, a resistor 70 is provided at a position between the second lead portion 33b and the GND.

The center of the coil portion 21 of the upper layer coil 20 and the center of the coil portion 31 of the lower layer coil 30 are aligned/matched, and their central axes are the Z axis. The central axis may also be called as the coil central axis. Further, between the upper layer coil 20 and the lower layer coil 30, one surface parallel to the coil portion 21 and the coil portion 31 is the XY plane.

The upper layer power source 40 is a high-frequency power source that supplies a high-frequency current to the upper layer coil 20. The upper layer power source 40 generates a high-frequency current in which one wavelength is the length of one loop of the coil portion 21. The lower layer power source 50 is a high-frequency power source that supplies a high-frequency current to the lower layer coil 30. The lower layer power source 50 generates a high-frequency current in which one wavelength is the length of one loop of the coil portion 31. Here, a high-frequency current of about 2.87 GHz is passed from the upper layer power source 40 and from the lower layer power source 50.

The magnetic field generator 1 is configured in the above-described manner. Although the details of the magnetic field generator 1 configured in such manner are described later, a high-frequency magnetic field is generated in the XY plane which is positioned between the upper layer coil 20 and the lower layer coil 30.

The diamond 2 corresponds to a magnetic field measuring element that measures an external magnetic field, and is arranged in the through hole 11. Here, the diamond 2 is arranged to be positioned in the XY plane that generates a high-frequency magnetic field at a position between the upper layer coil 20 and the lower layer coil 30. When the diamond 2 is irradiated with light having a specific wavelength and when a high-frequency magnetic field is applied thereto, the diamond 2 undergoes wavelength conversion to generate fluorescence.

The light source 3 irradiates the diamond 2 with, for example, a laser beam as light having a specific wavelength. The light source 3 is arranged outside of the substrate 10, that is, outside of the upper layer coil 20 and the lower layer coil in the radial direction, and irradiates the diamond 2 with light through a space between the upper layer coil 20 and the lower layer coil. Here, for example, the light source 3 is arranged so that the laser light is irradiated along the XY plane. However, the light source 3 may also be arranged so that the laser light is irradiated obliquely with respect to the XY plane. For example, a green laser beam is output from the light source 3, and the wavelength is converted by the diamond 2 to generate red fluorescence.

The temperature control unit 4 is used to adjust temperature of the diamond 2. The temperature control unit 4 is arranged to be in contact with the diamond 2. The diamond 2 generates fluorescence by converting the wavelength of the irradiated light, and at such time, energy loss occurs and heat is generated. The temperature control unit 4 adjusts temperature of the diamond 2 at the time of heat generation by cooling the diamond 2 or by other method.

The measurement unit 5 is for measuring the light emitted by the diamond 2, and is composed of a light receiving element or the like. As described above, when the diamond 2 fluoresces, fluorescence is output in various directions. Therefore, by arranging the measurement unit 5 outside the through hole 11, the measurement unit 5 is enabled to measure the light emission of the diamond 2. Then, the measurement unit 5 measures the light emitted by the diamond 2 to observe physical phenomena such as a shape of the diamond 2 and the like. Since the diamond 2 absorbs the energy due to the unpaired electrons of the measurement target based on ESR (Electron Spin Resonsance) and changes its characteristics, measurement of the generated minute magnetic field by the measurement target becomes measurable by/via the measurement of physical phenomena.

The magnetic sensor including the magnetic field generator 1 according to the present embodiment is configured in the above-described manner. As described above, the magnetic field generator 1 according to the present embodiment generates a high-frequency magnetic field, and the diamond 2 can be used as a measuring element to measure the external magnetic field. At such time, the magnetic field generator 1 is configured to generate a high-frequency magnetic field which has the magnetic field direction aligned in the XY plane, and in addition since the substrate 10 is thin, the minute amount of the magnetic field generated by the measurement target becomes measurable on the front and back surfaces above and below the substrate 10. Further, since the through hole 11 formed by hollowing out the substrate 10, the measurement target that is the source of the minute magnetic field can be brought closer to the diamond 2 or to the high-frequency magnetic field, thereby the minute magnetic field can be more accurately measured.

Here, the mechanism by which the magnetic field direction of the high-frequency magnetic field can be set to the XY plane as described above is described in comparison to the conventional structure.

As described above, the magnetic field generator 1 of the present embodiment has the upper layer coil 20 and the lower layer coil 30 arranged in an overlapping manner, which respectively receive supply of the high-frequency current from the upper layer power source 40 and the lower layer power source 50. Further, the lead portion 23 of the upper layer coil 20 and the lead portion 33 of the lower layer coil 30 are arranged to have the same position when viewed from the normal direction of the substrate 10. In such a configuration, a high-frequency current having a phase difference of 180° is applied to the upper layer coil 20 and the lower layer coil 30. Then, the frequency of the high-frequency current is set to around 2.87 GHz so that one wavelength of the high-frequency current becomes substantially equal to the length of one loop of the coil portion 21 of the upper layer coil 20 and the coil portion 31 of the lower layer coil 30.

In the following description, the phase of the high-frequency current at an end (i.e., the lead portion) of the coil portion 21 of the upper layer coil 20 and the coil portion 31 of the lower layer coil 30 where the high-frequency current is input at a supply start timing of the high-frequency current is referred to as an initial phase.

Figure 5A:
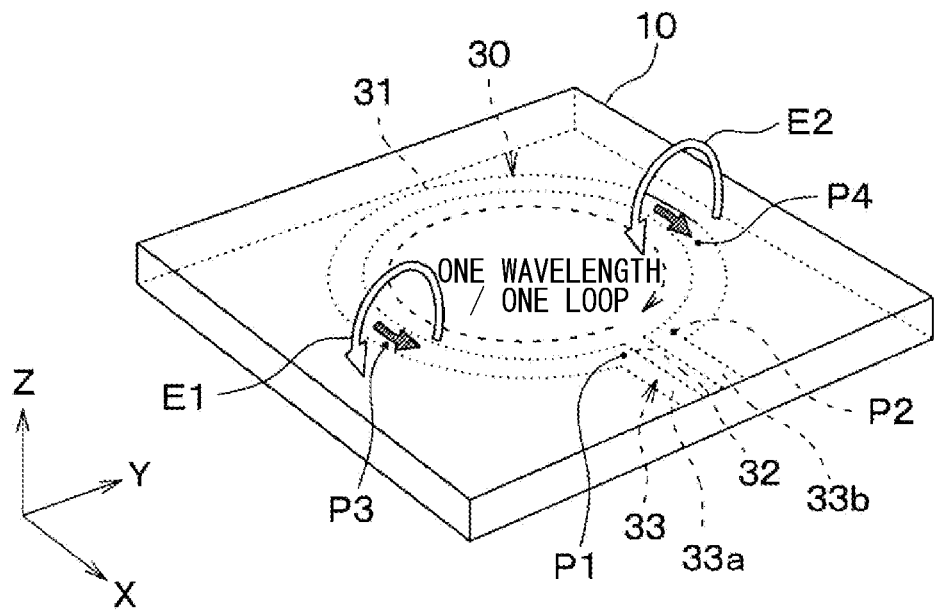
FIG. 5A is a perspective view illustrating a magnetic field generated in a lower layer coil.
Figure 5B:
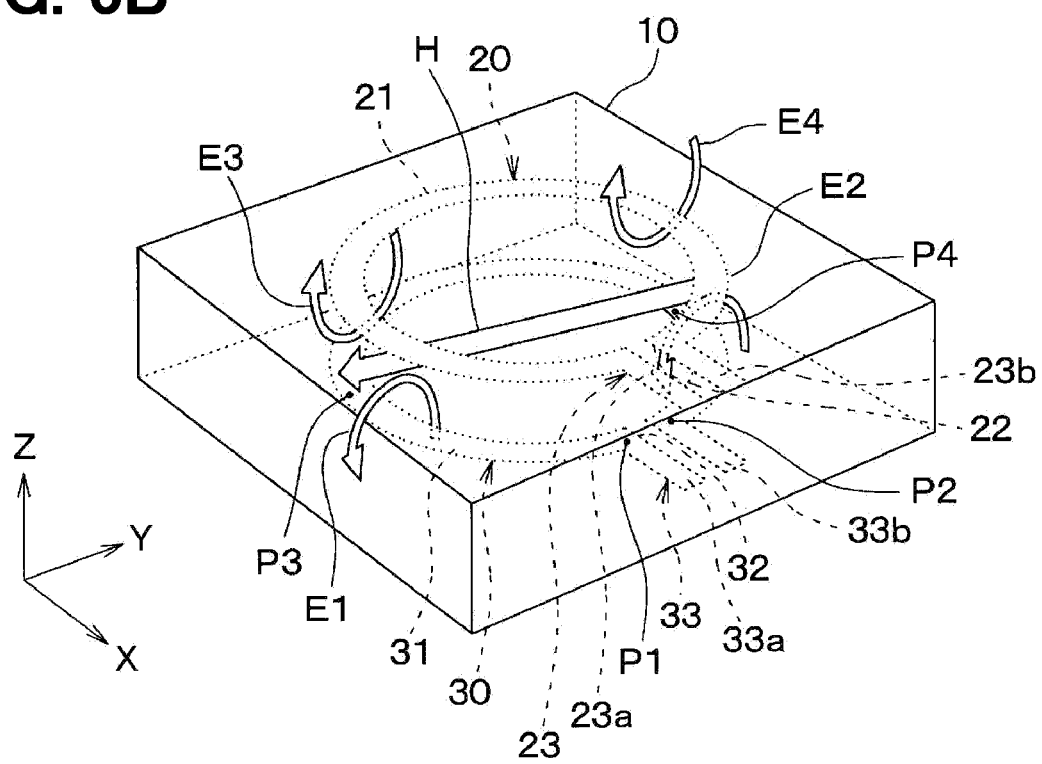
FIG. 5B is a perspective view illustrating a magnetic field generated in the lower layer coil and an upper layer coil and a high-frequency magnetic field generated thereby.
Figure 7:
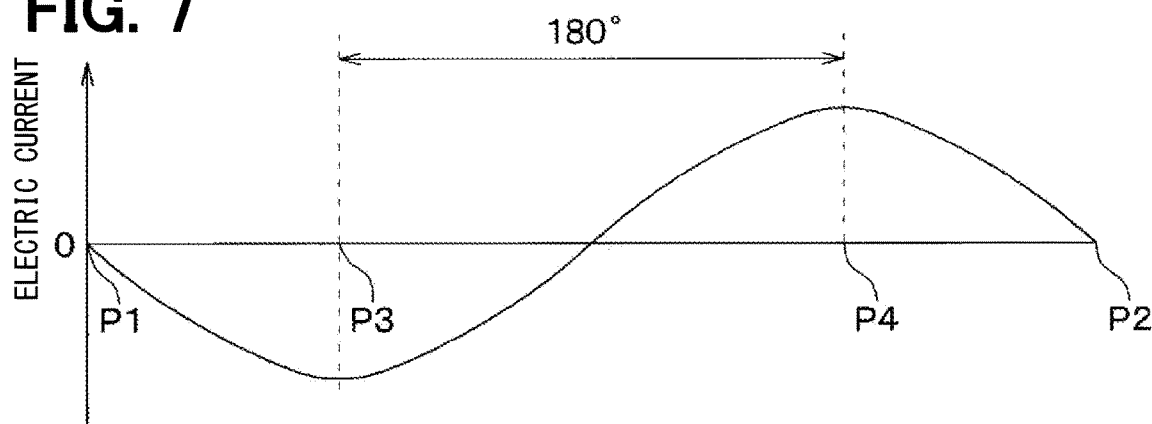
FIG. 7 is a waveform diagram of a high-frequency current.

When such a high-frequency current is passed, for example, in the lower layer coil 30, as shown in FIGS. 5A and 5B, a high-frequency current is passed (i.e., flows) from the first lead portion 33*a* to the second lead portion 33*b*. In such case, at a point P1, which is a position of the first lead portion 33*a*, of 0° and a point P2, which is a position of the second lead portion 33*b*, of 360°, the polarity of the electric current is reversed from each other at point symmetric position about the coil central axis. For example, assuming that the waveform of the high-frequency current flowing at each position from 0° to 360° at an arbitrary timing is as shown in FIG. 7, the phases are reversed at points P3 and P4, and the directions of the electric currents become opposite to each other. Therefore, for example, at the point P3 at a 90° position and the point P4 at a 270° position in FIG. 5A, counter-clockwise magnetic fields E1 and E2 are generated based on the right-handed screw rule when seen from the first lead portion 33*a* and the second lead portion 33*b*.

Figure 6:
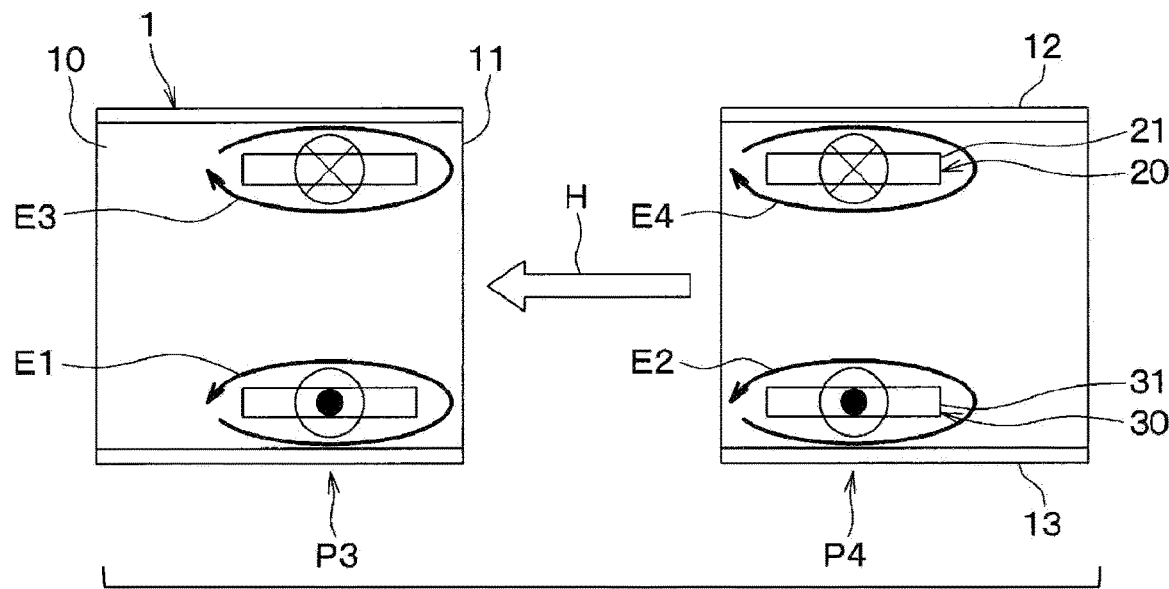
FIG. 6 is a cross-sectional view illustrating a magnetic field generated in the lower layer coil and the upper layer coil and the high-frequency magnetic field generated thereby.

On the other hand, since a high-frequency current having a phase difference of 180° from that of the lower layer coil 30 is passed to the upper layer coil 20, a magnetic field opposite to that of the lower layer coil 30 is generated in the upper layer coil 20. Therefore, for example, when the magnetic fields at the positions of the points P3 and P4 are shown, the upper layer coil 20 has clockwise magnetic fields E3 and E4 generated therein, and the lower layer coil 30 has a counter-clockwise magnetic fields E1 and E2 generated therein, respectively as shown in FIGS. 5B and 6.

Therefore, directions of the magnetic fields E1 to E4 match (i.e., are aligned) with each other at/around the positions of the points P3 and P4 in the substrate 10, or in other words, at positions in between the upper layer coil 20 and the lower layer coil 30, i.e., (A) the magnetic fields E1 and E3 have the same direction at a lower part of an upper layer portion having the upper layer coil 20 (i.e., at a position close to the lower layer coil 30) and an upper part of a lower layer portion having the lower layer coil 30 (i.e., at a position close to the upper layer coil 20) and (B) the magnetic fields E2 and E4 have the same direction at a lower part of an upper layer portion having the upper layer coil 20 (i.e., at a position close to the lower layer coil 30) and an upper part of a lower layer portion having the lower layer coil 30 (i.e., at a position close to the upper layer coil 20). In such manner, a high-frequency magnetic field H is generated between the upper layer coil 20 and the lower layer coil 30 with a direction from the point P4 to the point P3 as the magnetic field direction, as shown by a white arrow in FIG. 5B. Since the electric current flowing in the upper layer coil 20 and the lower layer coil 30 is a high-frequency current, the position where the current amplitude takes the maximum value and the position where the current amplitude takes the minimum value respectively change, thereby a high-frequency magnetic field having the magnetic field direction changed accordingly on the XY plane is generated.

Figure 8:
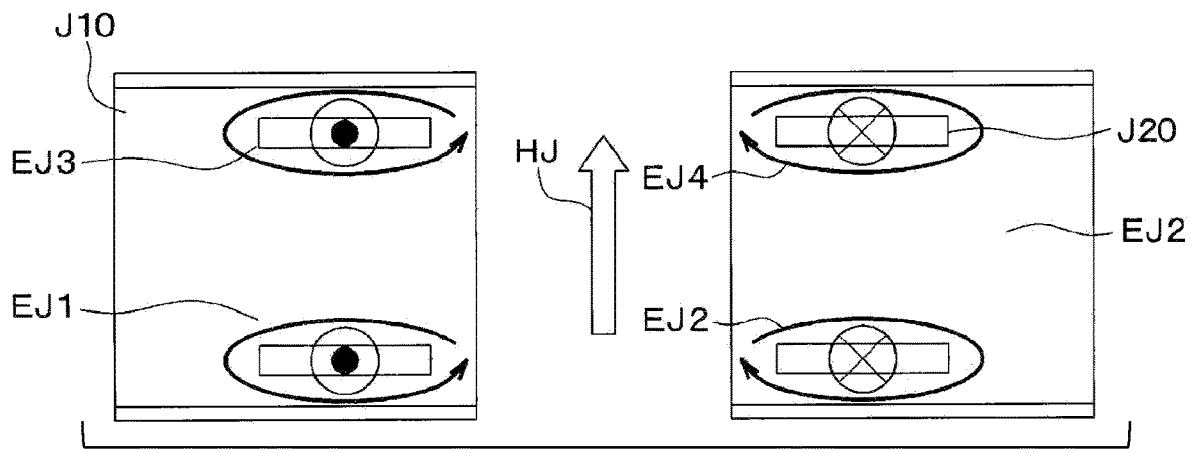
FIG. 8 is a cross-sectional view illustrating a high-frequency magnetic field generated by a winding coil wound by a plurality of times as a comparative example.

As a comparative example shown in FIG. 8, consider a case where a direct current is passed in a structure in which a coil J20 wound by a plurality of times is provided in a substrate J10. In case of such a configuration, the electric current is reversed at a position symmetrical with respect to the coil central axis. Therefore, as shown in the figure (FIG. 8), a counter-clockwise magnetic field EJ1 is generated at the position on the left side of the drawing where the electric current in the coil 20 flows in a direction to come up from behind the paper surface toward the reader in each of the plural windings of the coil J20. Further, a clockwise magnetic field EJ2 is generated at the position on the right side of the drawing where the electric current flows in a direction to sink into the paper surface away from the reader. Therefore, a high-frequency magnetic field HJ in the coil central axis direction is generated in the coil J20. In such a case, the measurement target needs to be arranged on the lateral side of the substrate J10, that is, on an outer side in the radial direction of the coil J20, which may pose a limitation regarding how close the measurement target is positionable relative to the coil J20 due to the structure described above. Further, if the measurement target is placed directly above or below the substrate J10, that is, in the axial direction of the coil J20, though the distance to the measurement target becomes shorter, the external magnetic field is measurable because the magnetic sensor has no sensitivity in the axial direction.

Therefore, it can be said that it is effective to use the magnetic field generator 1 capable of making the XY plane in the magnetic field direction as in the present embodiment.

As described above, in the magnetic field generator 1 of the present embodiment, the upper layer coil 20 and the lower layer coil 30 are arranged to be capable of supplying high-frequency electric current from the upper layer power source 40 and the lower layer power source 50, respectively. Further, the lead portion 23 of the upper layer coil 20 and the lead portion 33 of the lower layer coil 30 are arranged to have the same position when viewed from the normal direction of the substrate 10. In such a configuration, a high-frequency current having a phase difference of 180° is passed through the upper layer coil 20 and the lower layer coil 30. The length of one wavelength of the high-frequency current is set to be substantially equal to the length of one loop of the coil portion 21 of the upper layer coil 20 and the coil portion 31 of the lower layer coil 30.

In such a configuration, the direction of the magnetic field generated on a lower layer coil 30 side of the upper layer portion of the substrate 10 which has the upper layer coil 20 provided therein and the direction of the magnetic field generated on an upper layer coil 20 side of the lower layer portion of the substrate 10 which has the lower layer coil 30 provided therein are matched. This makes it possible to generate a high-frequency magnetic field having the XY plane as the magnetic field direction at a position between the upper layer coil 20 and the lower layer coil 30.

Thus, the magnetic sensor provided with such a magnetic field generator 1 is configured to have sensitivity in the axial direction of the upper layer coil 20 and the lower layer coil 30, and the measurement target generating a very small magnetic field is brought close either to an immediate/ directly above or to an immediate/directly below the substrate 10. Therefore, such a magnetic sensor is made more accurate.

Further, the magnetic field generator 1 of the present embodiment separately includes the upper layer power source 40 that supplies a high-frequency current to the upper layer coil 20 and the lower layer power source 50 that supplies a high-frequency current to the lower layer coil 30. Therefore, high-frequency currents having opposite phases are suppliable from the upper layer power source 40 and the lower layer power source 50 to the upper layer coil 20 and the lower layer coil 30, respectively.

Specifically, with respect to the magnetic field generator 1 of the present embodiment, the flow of electric current in the upper layer coil 20 and the lower layer coil 30 and the generated high-frequency magnetic field were investigated by simulation. As a result, diagrams shown in FIGS. 9A to 9C and 10 were obtained.

Figure 9B:
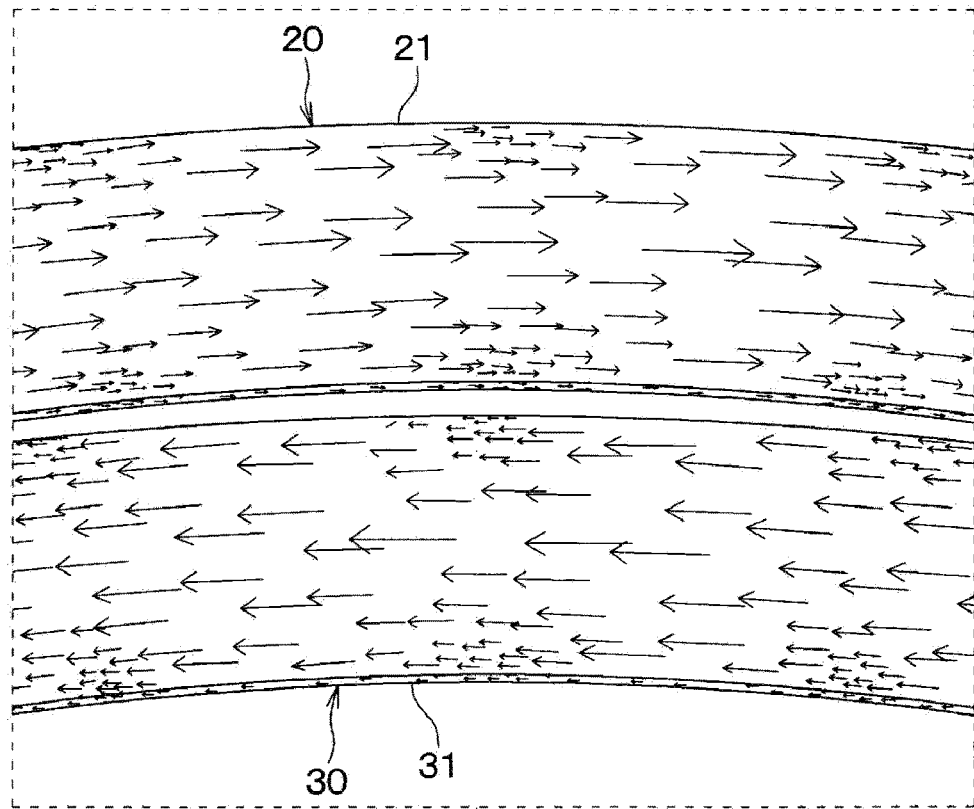
FIG. 9B is an enlarged view of a IXB region in FIG. 9A.
Figure 9C:
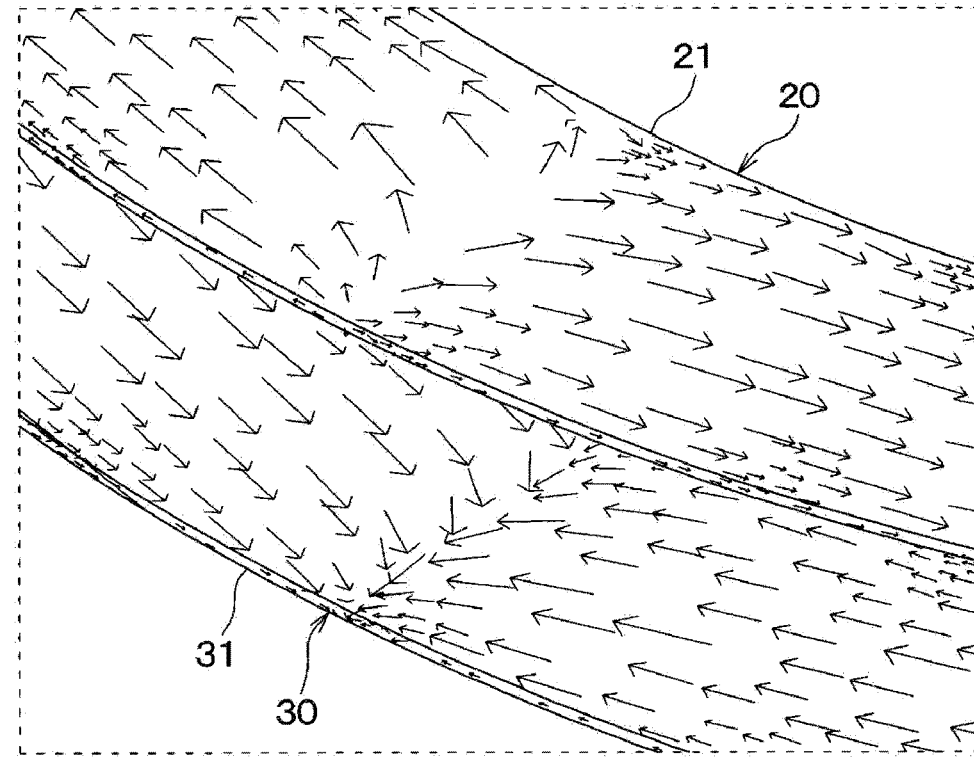
FIG. 9C is an enlarged view of a IXC region in FIG. 9A.

When high-frequency currents are passed through the upper layer coil 20 and the lower layer coil 30 and high-frequency currents have opposite phases with a 180° phase difference, the directions of the electric current at various parts at an arbitrary timing is shown in FIGS. 9A to 9C by arrows. That is, in the upper layer coil 20, the directions of the electric current are opposite to each other at point-symmetric positions with respect to the coil central axis. Similarly, in the lower layer coil 30, the directions of the electric current are opposite to each other at point-symmetric positions with respect to the coil central axis. Further, at the same angle position with respect to the coil central axis, the electric currents in the upper layer coil 20 and the lower layer coil 30 flow in opposite directions. Then, as shown in FIG. 9C, in the upper layer coil 20, an electric current is generated from an arbitrary position on one side opposite to the lead portion 23 with respect to the coil central axis, and in the lower layer coil 30, the electric current flows into any/arbitrary position on the opposite side of the lead portion 23 with respect to the coil central axis.

Figure 10:
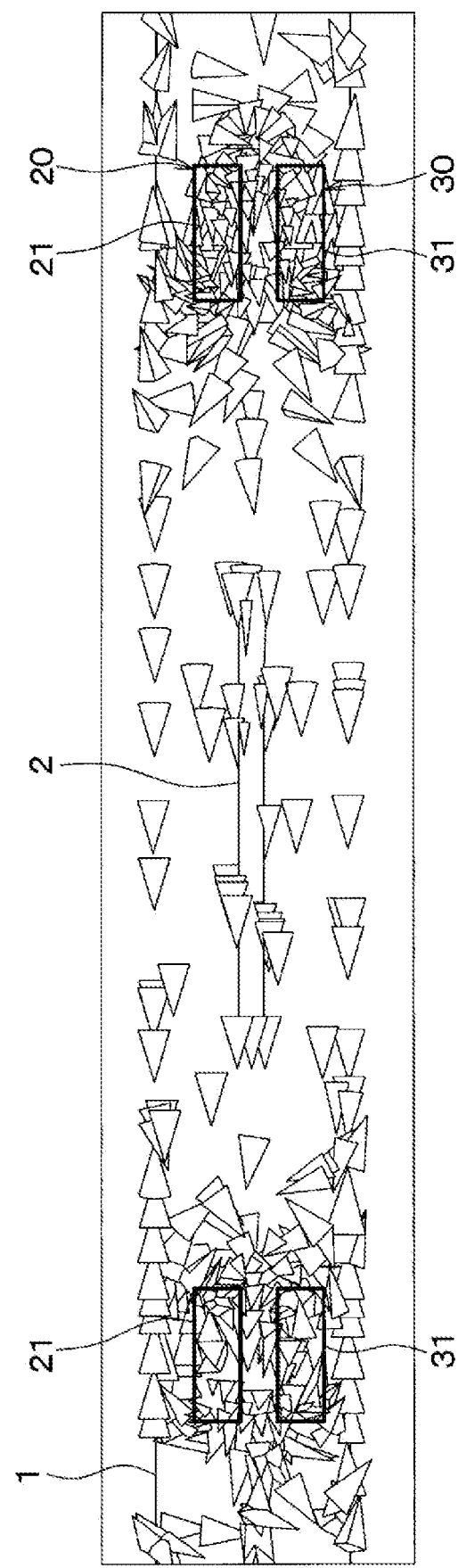
FIG. 10 is a diagram showing a simulation result of a high-frequency magnetic field generated by the magnetic field generator.

Therefore, in a cross section diagram shown in FIG. 10, the upper layer coil 20 generates a clockwise magnetic field, and the lower layer coil 30 generates a counter-clockwise magnetic field. Therefore, as shown in FIG. 10, at the position of the diamond 2, a high-frequency magnetic field pointing in a left direction of the paper surface is generatable, which shows that a high-frequency magnetic field is generatable in the XY plane.

Second Embodiment

The second embodiment is described. In the present embodiment, the configurations of the upper layer coil 20 and the lower layer coil 30 are changed from those in the first embodiment, and the other parts are the same as those in the first embodiment. Therefore, the description focuses on such difference.

Figure 11:
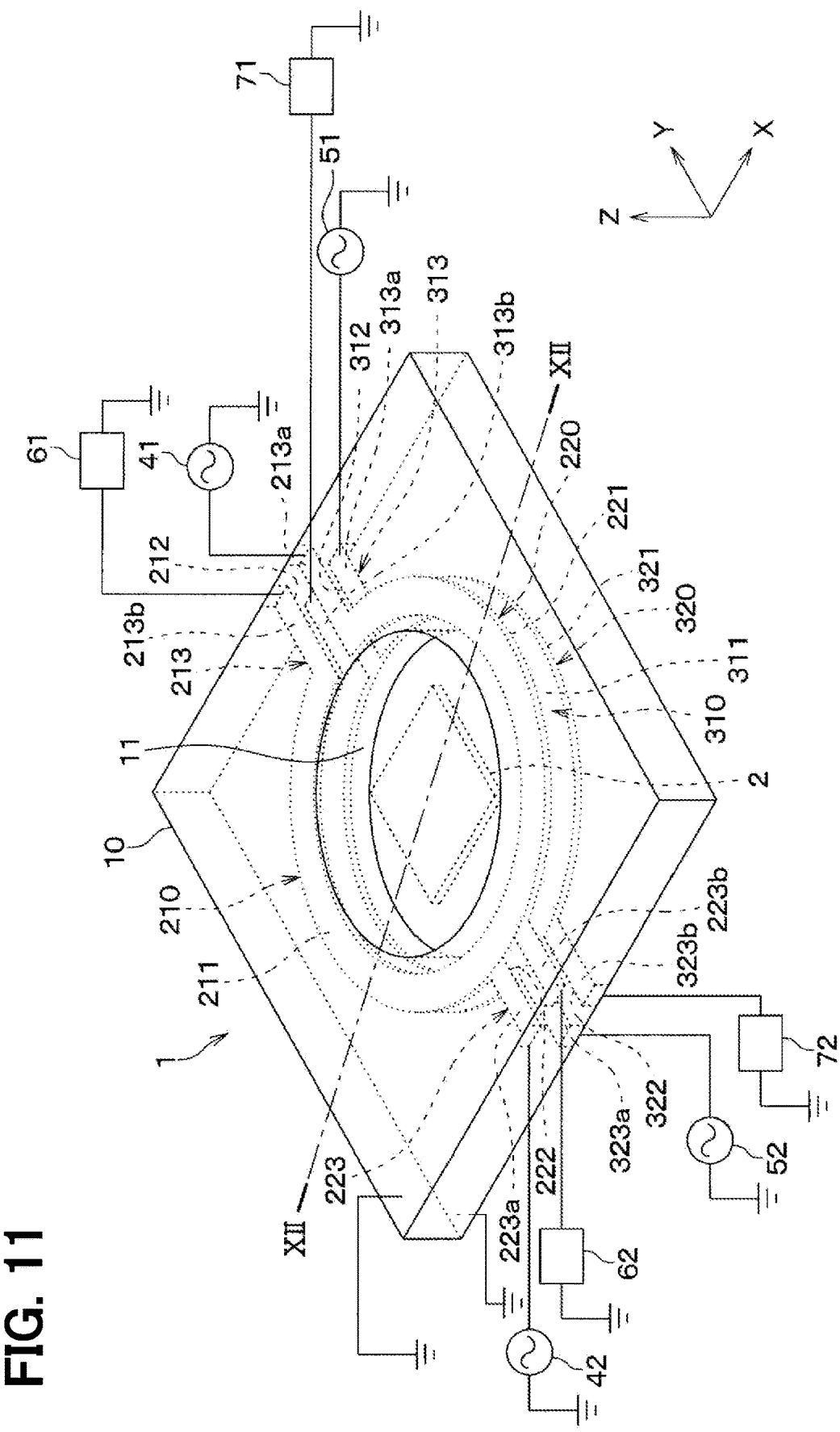
FIG. 11 is a diagram showing the magnetic field generator provided in the magnetic sensor according to a second embodiment.
Figure 12:
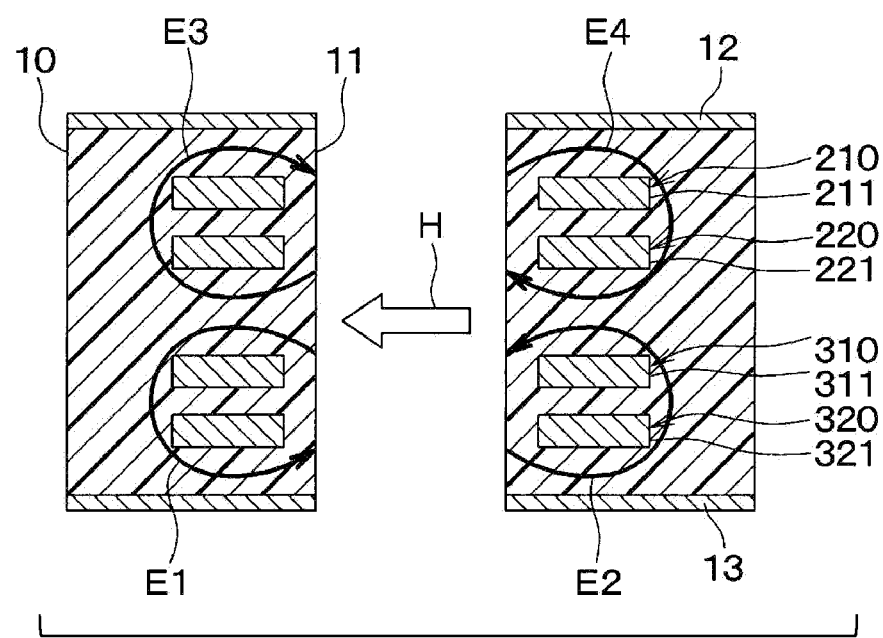
FIG. 12 is a cross-sectional view illustrating a magnetic field generated in a lower layer coil and an upper layer coil and a high-frequency magnetic field generated thereby in a XII-XII cross section in FIG. 11.

As shown in FIGS. 11 and 12, in the present embodiment, the upper layer coil 20 and the lower layer coil 30 provided in the magnetic field generator 1 each have a double-layer structure. That is, the upper layer coil 20 is composed of a first coil 210 and a second coil 220, and the lower layer coil 30 is composed of a third coil 310 and a fourth coil 320.

The first coil 210 is configured to have a coil portion 211, a slit 212, and a lead portion 213. The lead portion 213 including the coil portion 211, the slit 212, a first lead portion 213a and a second lead portion 213b has the same configuration as the coil portion 21, the slit 22 and the lead portion 23 described in the first embodiment. Further, the second coil 220 is configured to have a coil portion 221 and a slit 222 and a lead portion 223. The lead portion 223 having the coil portion 221 and the slit 222, a first lead portion 223a and a second lead portion 223b has the same configuration as the coil portion 21, the slit 22 and the lead portion 23 described in the first embodiment. However, here, the position where the slit 212 and the lead portion 213 of the first coil 210 are provided is different from the position where the slit 222 and the lead portion 223 of the second coil 220 are provided, and the position is shifted by 180° with respect to the coil central axis among the two.

Further, the upper layer power source 40 includes a first upper layer power source 41 and a second upper layer power source 42. The first upper layer power source 41 is connected to the first lead portion 213a to energize the first coil 210, and the second upper layer power source 42 is connected to the first lead portion 223a to energize the second coil 220.

Further, a resistor 61 connecting the second lead portion 213b to the GND and for reflection suppression is provided, and a resistor 62 connecting the second lead portion 223b to the GND and for reflection suppression is provided.

The third coil 310 is configured to have a coil portion 311, a slit 312, and a lead portion 313 having a first lead portion 313a and a second lead portion 313b. The coil portion 311, the slit 312, and the lead portion 313 have the same configuration as the coil portion 31, the slit 32, and the lead portion 33 described in the first embodiment. Further, the fourth coil 320 is configured to have a coil portion 321, a slit 322, and a lead portion 323 having a first lead portion 323a and a second lead portion 323b. The coil portion 321, the slit 322 and the lead portion 323 have the same configuration as the coil portion 31, the slit 32 and the lead portion 33 described in the first embodiment. However, here, the position where the slit 312 and the lead portion 313 of the third coil 310 are provided is different from the position where the slit 322 and the lead portion 323 of the fourth coil 320 are provided, and the position is shifted by 180° with respect to the coil central axis among the two.

Further, the lower layer power source 50 includes a first lower layer power source 51 and a second lower layer power source 52. The first lower layer power source 51 is connected to the first lead portion 313a to energize the third coil 310, and the second lower layer power source 52 is connected to the first lead portion 323a to energize the fourth coil 320.

Further, a resistor 71 connecting the second lead portion 313b to the GND and for reflection suppression is provided, and a resistor 72 connecting the second lead portion 323b to the GND and for reflection suppression is provided.

In such a configuration, a high-frequency current is passed through the first coil 210 and the second coil 220 constituting the upper layer coil 20 so that the electric currents at the same angle with respect to the coil central axis are in phase. That is, with respect to the first coil 210 and the second coil 220, since the positions of the lead portion 213 and the lead portion 223 are shifted by 180°, the phase of the high-frequency current to be passed is also shifted by 180°.

Further, a high-frequency current having the same phase at the same angle with respect to the coil central axis is also passed through the third coil 310 and the fourth coil 320 constituting the lower layer coil 30. However, for the third coil 310 and the fourth coil 320, high-frequency currents having a 180° phase difference from the first coil 210 and the second coil 220 are provided. That is, since the positions of the lead portion 313 and the lead portion 323 of the third coil 310 and the fourth coil 320 are also shifted by 180°, the phase of the high-frequency current to be passed is also shifted by 180°. Further, regarding the third coil 310, since the lead portion 313 is arranged at the same angle as the lead portion 213 of the first coil 210, the high-frequency current is 180° out of phase with respect to the first coil 210. Similarly, with respect to the fourth coil 320, since the lead portion 323 is arranged at the same angle as the lead portion 223 of the second coil 220, the high-frequency current is 180° out of phase with respect to the second coil 220.

In such manner, as shown in FIG. 12, the magnetic fields E3 and E4 in the same direction can be generated at the same angle with respect to the coil central axis in the first coil 210 and the second coil 220. Further, the magnetic fields E1 and E2 in opposite directions can be generated in the third coil 310 and the fourth coil 320 at the same angle as the magnetic fields E3 and E4 of the first coil 210 and the second coil 220 with respect to the coil central axis.

Therefore, even if the upper layer coil 20 and the lower layer coil 30 are composed of two layers, a high-frequency magnetic field H having the XY plane as the magnetic field direction can be generated between the upper layer coil 20 and the lower layer coil 30. If the upper layer coil 20 and the lower layer coil 30 are composed of two layers in such manner, the intensity of the magnetic field generated by the upper layer coil 20 and the lower layer coil 30 can be increased, and a stronger high-frequency magnetic field is generatable.

Third Embodiment

The third embodiment is described. The present embodiment is a modification of the layout of the upper layer coil 20 and the lower layer coil 30 in the first embodiment, and has the same configuration as the first embodiment for the other part. Thus, the description focuses on difference therefrom.

Figure 13:
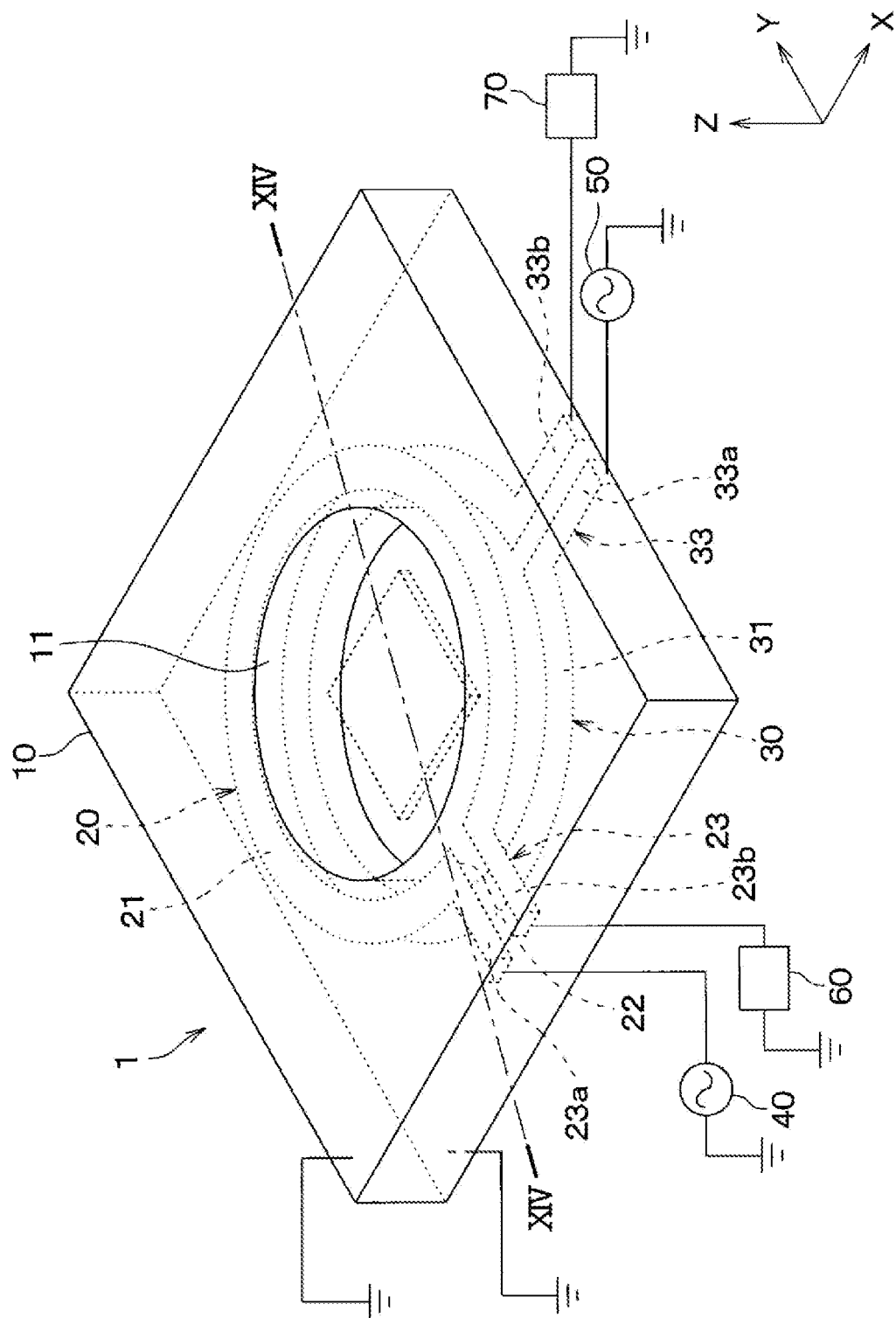
FIG. 13 is a diagram showing a magnetic field generator provided in the magnetic sensor according to a third embodiment.
Figure 14:
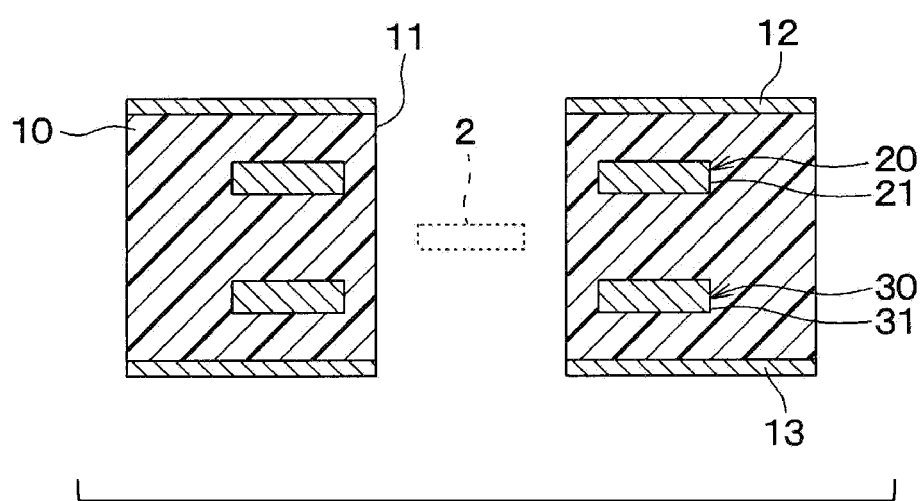
FIG. 14 is a cross-sectional view taken along a XIV-XIV line in FIG. 13.

As shown in FIGS. 13 and 14, in the present embodiment, the formation positions of the slit 22 and the lead portion 23 of the upper layer coil 20 and the formation positions of the slit 32 and the lead portion 33 of the lower layer coil 30 are different. Here, the formation positions of the slit 22 and the lead portion 23 of the upper layer coil 20 and the formation positions of the slit 32 and the lead portion 33 of the lower layer coil 30 are shifted by 90° with respect to the coil central axis. Specifically, assuming that the position of the first lead portion 23a in the upper layer coil 20 is 0° and the position of the second lead portion 23b is 360°, the slit 32 and the lead portion 33 in the lower layer coil 30 are arranged at 270°.

In such a configuration, the initial phase of the high-frequency current flowing through the upper layer coil 20 is set to 90°, and the initial phase of the high-frequency current flowing through the lower layer coil 30 is set to 0°. In such manner, the phase of the high-frequency current can be shifted by 180° at the same angle with respect to the coil central axis among the upper layer coil 20 and the lower layer coil 30.

Therefore, even if the formation positions of the slit 22 and the lead portion 23 of the upper layer coil 20 and the formation positions of the slit 32 and the lead portion 33 of the lower layer coil 30 are different angles, i.e., without having the same angle, with respect to the coil central axis, the same effect as the first embodiment is obtainable.

Here, the formation positions of the slit 22 and the lead portion 23 of the upper layer coil 20 and the formation positions of the slit 32 and the lead portion 33 of the lower layer coil 30 are shifted by 90° with respect to the coil central axis. However, the shift angle may be other than 90°, of course.

Fourth Embodiment

The fourth embodiment is described. In the present embodiment, the shapes of the upper layer coil 20 and the lower layer coil 30 are changed with respect to the first to third embodiments, and the other parts are the same as those in the first to third embodiments. Thus, only the different parts from the first to third embodiments are described.

Figure 15:
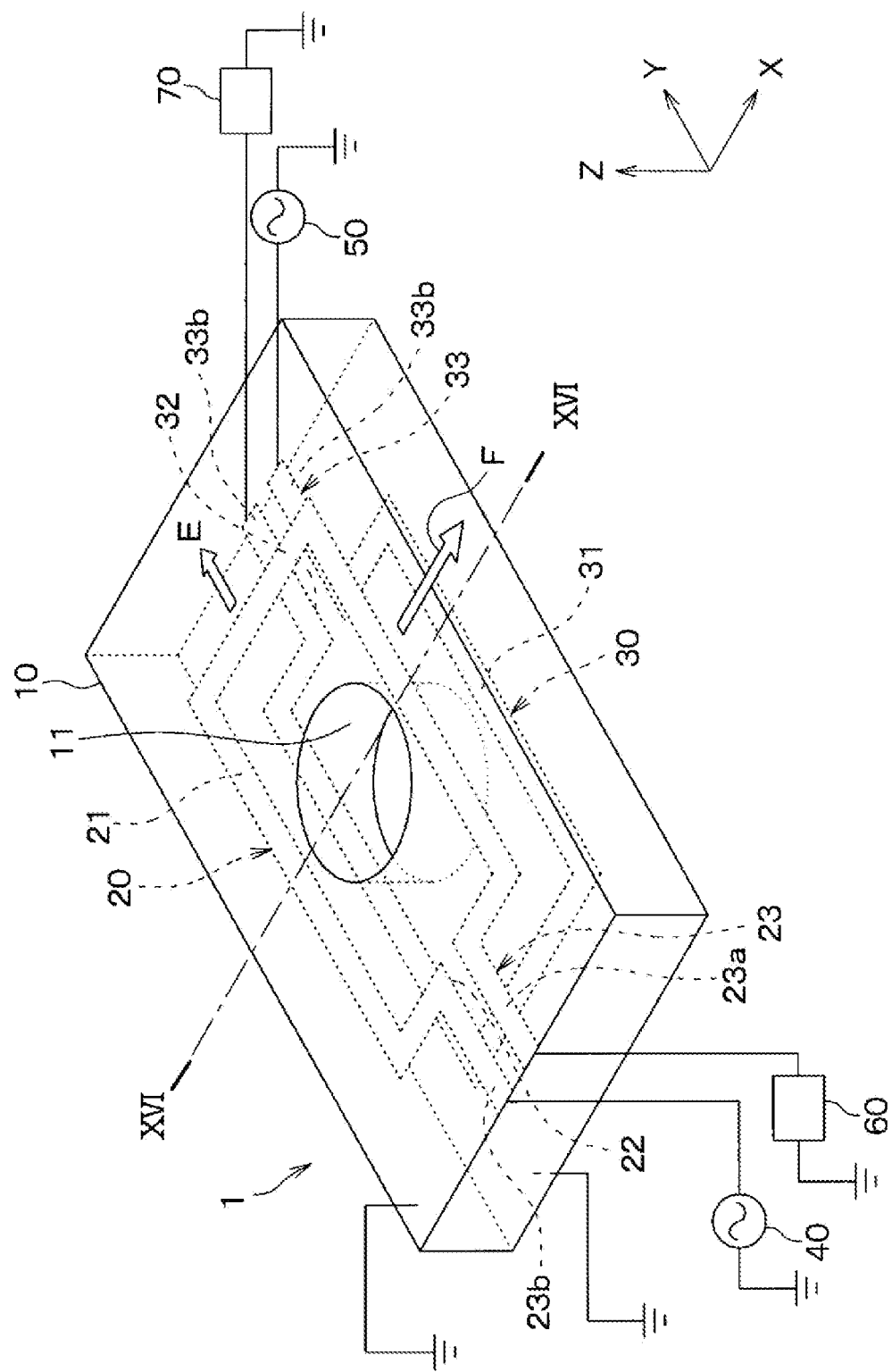
FIG. 15 is a diagram showing a magnetic field generator provided in the magnetic sensor according to a fourth embodiment.
Figure 16:
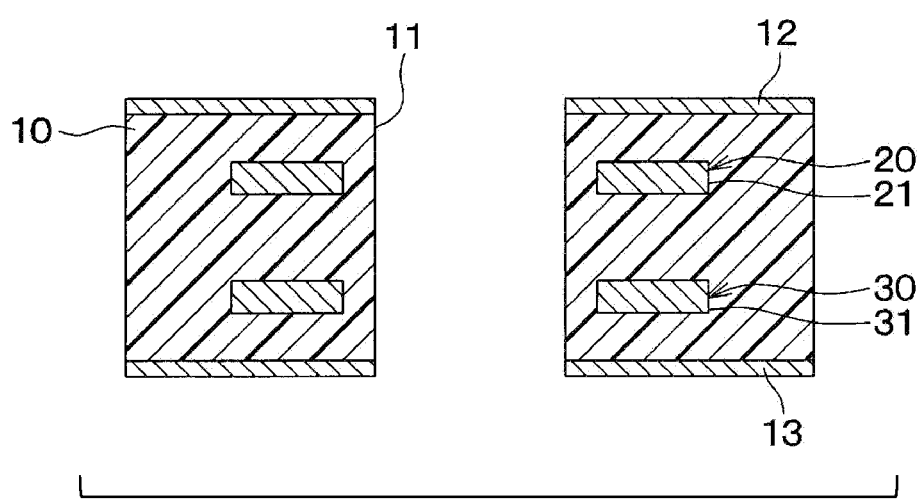
FIG. 16 is a cross-sectional view taken along a XVI-XVI line in FIG. 15.

As shown in FIGS. 15 and 16, in the present embodiment, the coil portion 21 of the upper layer coil 20 and the coil portion 31 of the lower layer coil 30 are not annular but square. Specifically, the coil portion 21 is formed in a rectangular shape composed of two opposing short sides and two opposing long sides, and the slit 22 and the lead portion 23 are arranged on one of the short sides. Similarly, the coil portion 31 is formed in a rectangular shape composed of two opposing short sides and two opposing long sides, and the slit 32 and the lead portion 33 are arranged on one of the short sides. The coil portion 21 and the coil portion 31 are arranged to face each other so that their short sides overlap each other and their long sides overlap each other (in a plan view).

The slit 22, the lead portion 23, the slit 32, and the lead portion 33 may be arranged at the same angle with respect to the coil central axis as in the first embodiment. However, in the present embodiment, they are arranged at positions shifted by 180°. In such an arrangement, a high-frequency current having an initial phase of 0° may be passed through the upper layer coil 20 and the lower layer coil 30.

In such manner, even when the coil portion 21 and the coil portion 31 have a quadrangular shape, the same effect as the first embodiment is achievable if the length per loop is set to one wavelength of the high-frequency current flowing through them.

Further, when the coil portion 21 and the coil portion 31 have a rectangular shape, by adjusting an aspect ratio, which is a ratio of a vertical dimension to a horizontal dimension of the rectangular shape on the XY plane, the magnetic field direction is controllable. When the coil portion 21 and the coil portion 31 have a rectangular shape, the aspect ratio corresponds to a ratio of the long side to the short side. In such a configuration, a high-frequency magnetic field can be generated weakly in the direction of an arrow E along the long side and strongly in the direction of an arrow F along the short side. Therefore, the direction of the magnetic field can be substantially controlled in the direction of the arrow F.

Fifth Embodiment

The fifth embodiment is described. The present embodiment is the same as the first to fourth embodiments in that the form of the high-frequency current input to the upper layer coil 20 and the lower layer coil 30 is changed from the first to fourth embodiments. Therefore, only the parts different from the first to fourth embodiments in the present embodiment are described.

Figure 17:
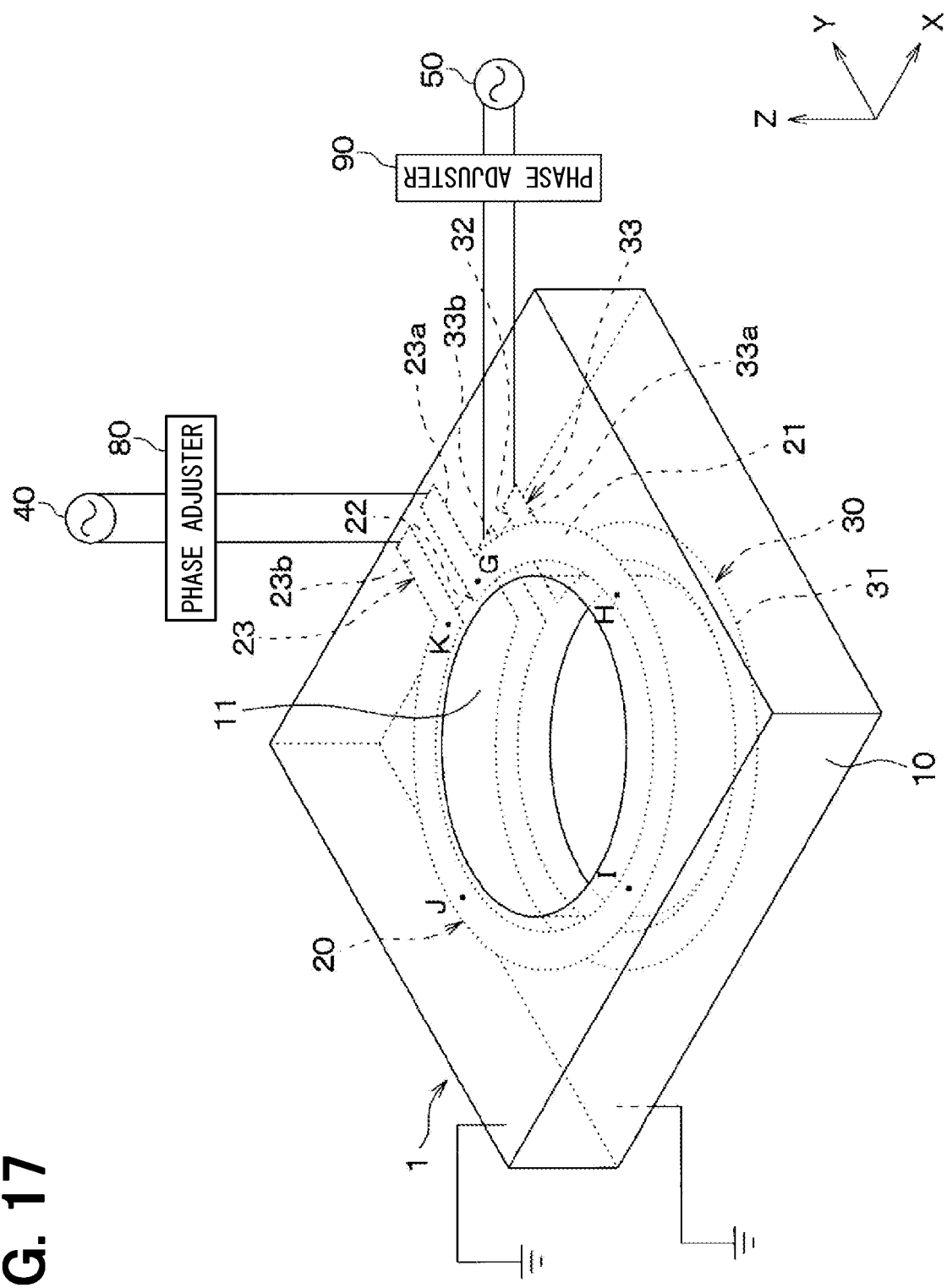
FIG. 17 is a diagram showing a magnetic field generator provided in the magnetic sensor according to a fifth embodiment.

As shown in FIG. 17, in the magnetic field generator 1 of the present embodiment, a phase adjuster 80 that adjusts the phase of the high-frequency current flowing through the upper layer coil 20 and a phase adjuster 90 that adjusts the phase of the high-frequency current flowing through the lower layer coil 30 are provided. Then, the high-frequency current output from the upper layer power source 40 is phase-adjusted by the phase adjuster 80, and a high-frequency current having the same phase is passed through both the first lead portion 23a and the second lead portion 23b to both ends of the coil portion 21. Similarly, the high-frequency current output from the lower layer power source 50 is phase-adjusted by the phase adjuster 90, and a high-frequency current having the same phase is passed through both the first lead portion 33a and the second lead portion 33b to both ends of the coil portion 31.

Figure 18:
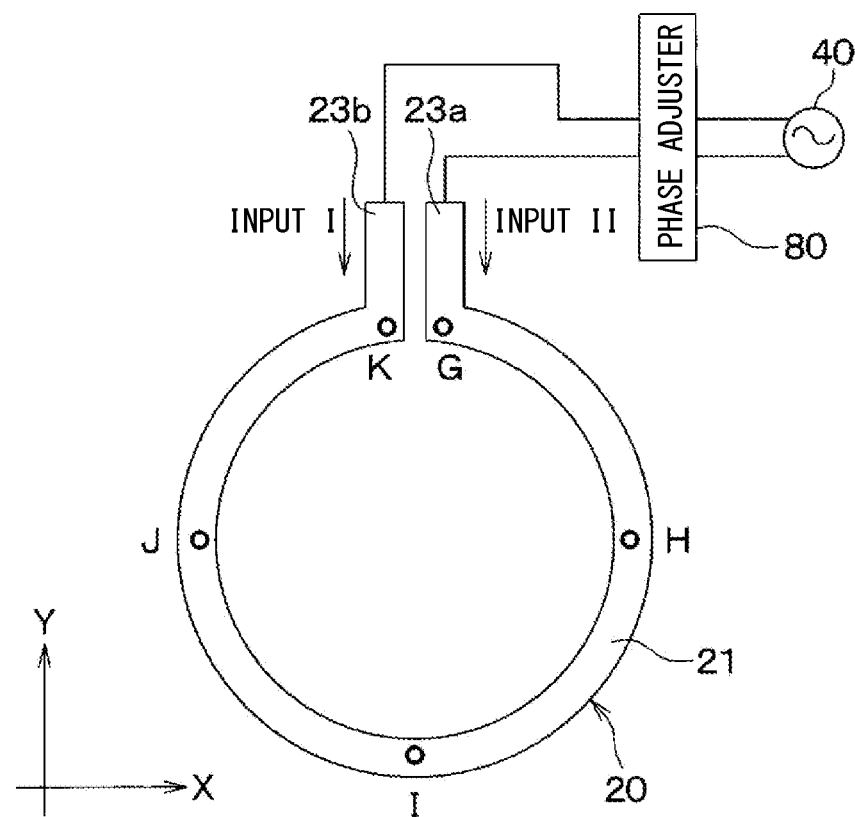
FIG. 18 is an illustration of various positions between a first lead portion and a second lead portion in the upper layer coil as points G to K.
Figure 19A:
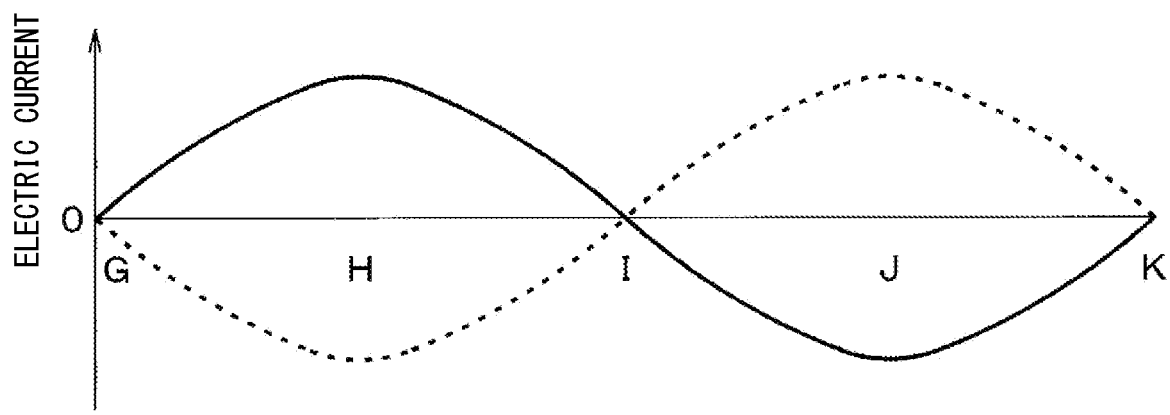
FIG. 19A is a diagram showing a relationship between a standing wave of a high-frequency current and points G to K in FIG. 18.

In the magnetic field generator 1 configured in such manner, a standing wave can be generated by a high-frequency current flowing through the upper layer coil 20 and the lower layer coil 30. For example, as shown in FIGS. 17 and 18, the upper layer coil 20 has, for an illustration of the phase, four points G to K, substantially at every 90° intervals with respect to the coil central axis from one end on a first lead portion 23a side to the other end on a second lead portion 23b side. In such case, for example, a high-frequency current is supplied to both ends of the coil portion 21 as an input I and an input II, and the phase difference of the high-frequency current is set to 0° (i.e., no phase difference among the inputs I and II). In such manner, as shown in FIG. 19A, a standing wave having the positions of points G, I, and K as nodes and the positions of points H and J as antinodes having the maximum amplitude can be generated by a high-frequency current. In such case, it is possible to generate a high-frequency magnetic field in which the magnetic field direction alternates repeatedly between the following two directions, i.e., in a direction from the point H to the point J and a direction from the point J to the point H.

Figure 19B:
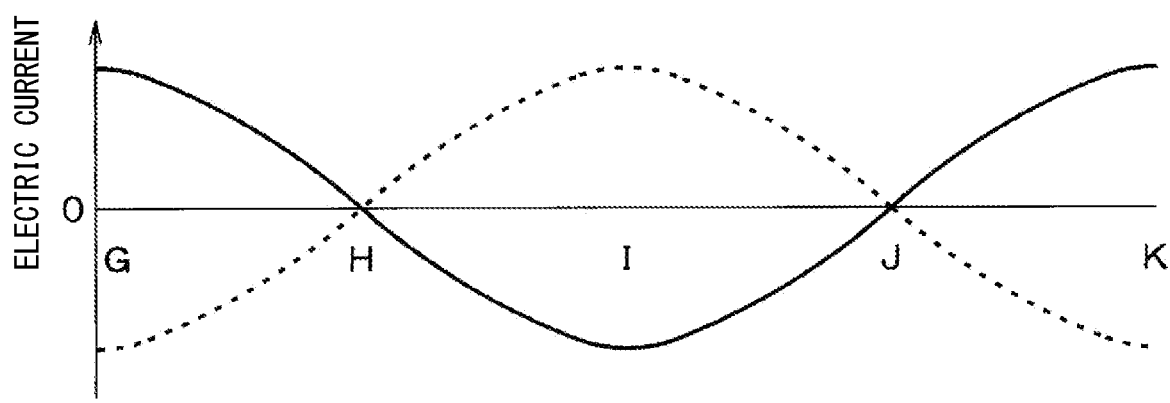
FIG. 19B is a diagram showing a relationship between the standing wave of a high-frequency current and points G to K in FIG. 18.

Further, for example, when the phase difference of the high-frequency currents flowing from both ends of the coil portion 21 is set to 180°, as shown in FIG. 19B, a standing wave with the positions of the points G, I, and K as an anti-node and the positions of points H and J as a node can be generated. In such case, it is possible to generate a high-frequency magnetic field in which the magnetic field direction alternates repeatedly between the following two directions, i.e., in a direction from the point G or the point K to the point I and a direction from the point I to the point G or the point K.

Further, though an example of the upper layer coil 20 has been described with reference to FIGS. 18, 19A and 19B, the same applies to the lower layer coil 30. Then, a standing wave having a 180° phase difference is formed respectively in the upper layer coil 20 and the lower layer coil 30. In such manner, matching between the directions of the two magnetic fields is achievable. That is, the direction of the magnetic field generated on a lower layer coil 30 side of the upper layer portion of the substrate 10 which has the upper layer coil 20 provided therein and the direction of the magnetic field generated on an upper layer coil 20 side of the lower layer portion of the substrate 10 which has the lower layer coil 30 provided therein are matchable. Therefore, a high-frequency magnetic field having the XY plane as the magnetic field direction can be generated.

In such manner, a standing wave can be generated by allowing a high-frequency current to flow from both ends of the upper layer coil 20 and the lower layer coil 30. Thus, while limiting the magnetic field direction to a certain/ specific direction(s), a high-frequency magnetic field having alternate magnetic field directions of 180° is generatable on the XY plane.

Note that the phase adjuster 80 generating high-frequency currents input from both of the first lead portion 23a and the second lead portion 23b based on one signal source of the upper layer power source 40 in the present disclosure may be modifiable. That is, the phase adjuster 80 not only adjusts the phase based on one signal and divides it into two signals, but may also adjust the phase of each signal using the two signals and outputs the adjusted as a high-frequency current. Of course, the same applies to the phase adjuster 90.

Sixth Embodiment

The sixth embodiment is described. The present embodiment is the same as the first to fourth embodiments in that the form of the high-frequency current input to the upper layer coil 20 and the lower layer coil 30 is changed from the first to fourth embodiments. Therefore, only the parts different from the first to fourth embodiments in the present embodiment are described.

Figure 20A:
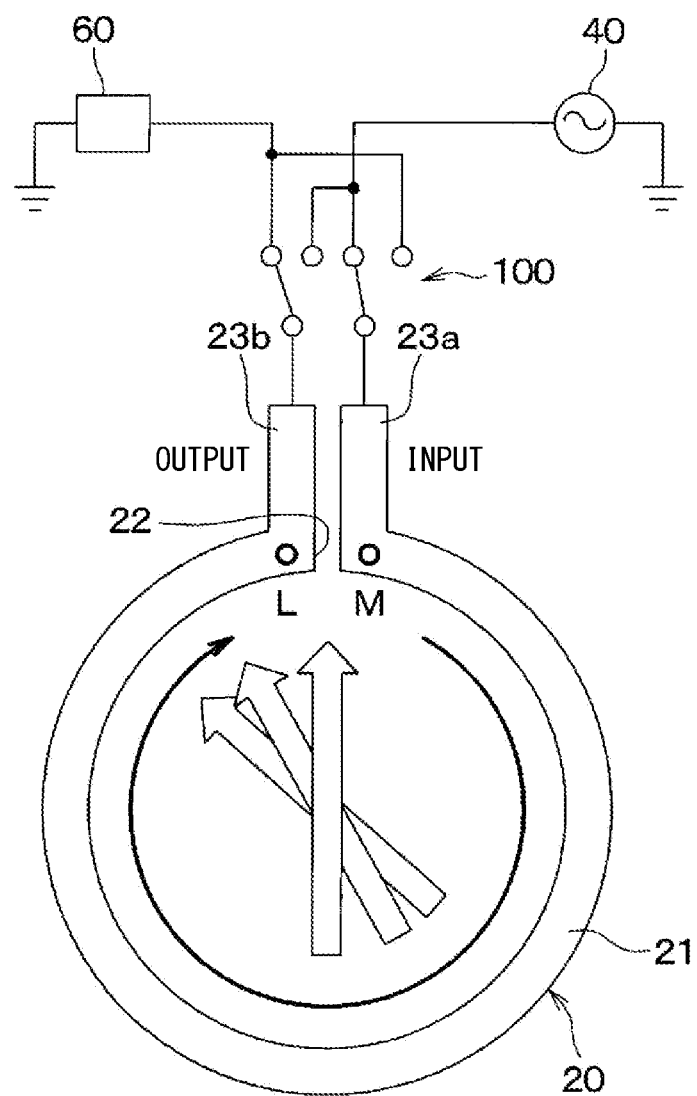
FIG. 20A is a diagram showing a state in which a magnetic field direction is clockwise in a sixth embodiment.
Figure 20B:
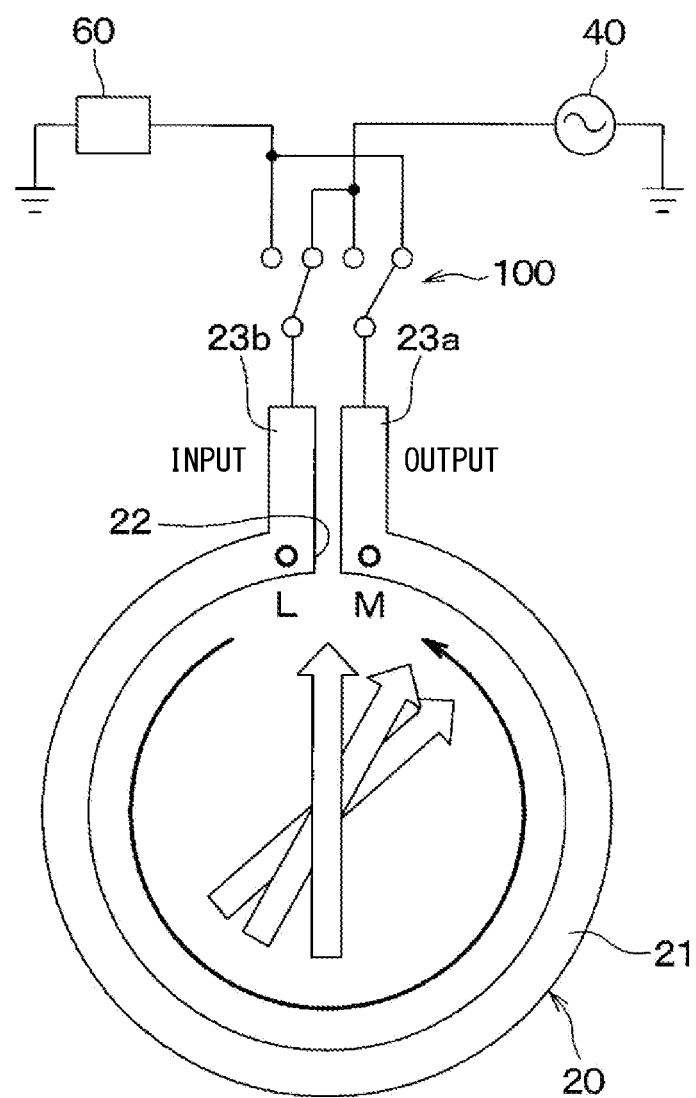
FIG. 20B is a diagram showing a state in which the magnetic field direction is counter-clockwise in the sixth embodiment.

In the magnetic field generator 1 of the present embodiment, as shown in FIGS. 20A and 20B, the same configuration as that of the first embodiment and the like is further modified, for controlling the input direction of the high-frequency current to the upper layer coil 20 to be switchable, thereby allowing clockwise and counter-clockwise rotation of the magnetic field direction as a circularly polarized wave. For example, as shown in FIGS. 20A and 20B, an input change switch 100 is provided between the upper layer coil 20 and the upper layer power source 40 and the resistor 60, for the switching of the input end of the upper layer coil 20 which receives an input of a high-frequency current. Further, although not illustrated, the lower layer coil 30 is also provided with the input change switch 100 just like the upper layer coil 20, at a position between the lower layer coil 30 and the lower layer power source 50 or the resister 70, for switching an input of the high-frequency current.

In such manner, it possible to control the rotation direction of the magnetic field direction on the XY plane. For example, a high-frequency current is input from the first lead portion 23a to the upper layer coil 20, and a 180° phase difference is added to the lower layer coil 30 relative to the upper layer coil 20 for an input of a high-frequency current from the first lead portion 33a. In such case, as shown in FIG. 20A, the direction of the magnetic field can be rotated rightward, i.e., clockwise, from a point M toward a point L.

On the contrary, a high-frequency current is input to the upper layer coil 20 from the second lead portion 23b, and a 180° phase difference is also added to the lower layer coil 30 relative to the upper layer coil 20 for an input of a high-frequency current from the second lead portion 33b. In such case, as shown in FIG. 20B, the direction of the magnetic field can be rotated leftward, i.e., counter-clockwise, from the point L to the point M.

In particular, in a magnetic sensor using a diamond NVC (Nitrogen Vacancy Center), circularly polarized waves are used for a high-frequency magnetic field, and by switching the direction of the circularly polarized waves, unpaired electrons can be selectively pumped to either of degeneracy ms=±1. In such manner, a highly sensitive magnetic sensor with excellent minimum resolution can be realized.

Seventh Embodiment

The seventh embodiment is described. In the present embodiment, the upper layer coil 20 is changed to a resonance coil with respect to the first to sixth embodiments, and the other parts are the same as those in the first to sixth embodiments. Therefore, only the parts different from the first to sixth embodiments are described in the present embodiment. In the following, a case where the coil portion 21 of the upper layer coil 20 and the coil portion 31 of the lower layer coil 30 respectively have an annular shape as in the first embodiment is described as an example. However, configuration may also be the one as shown in the second to sixth embodiments.

Figure 21:
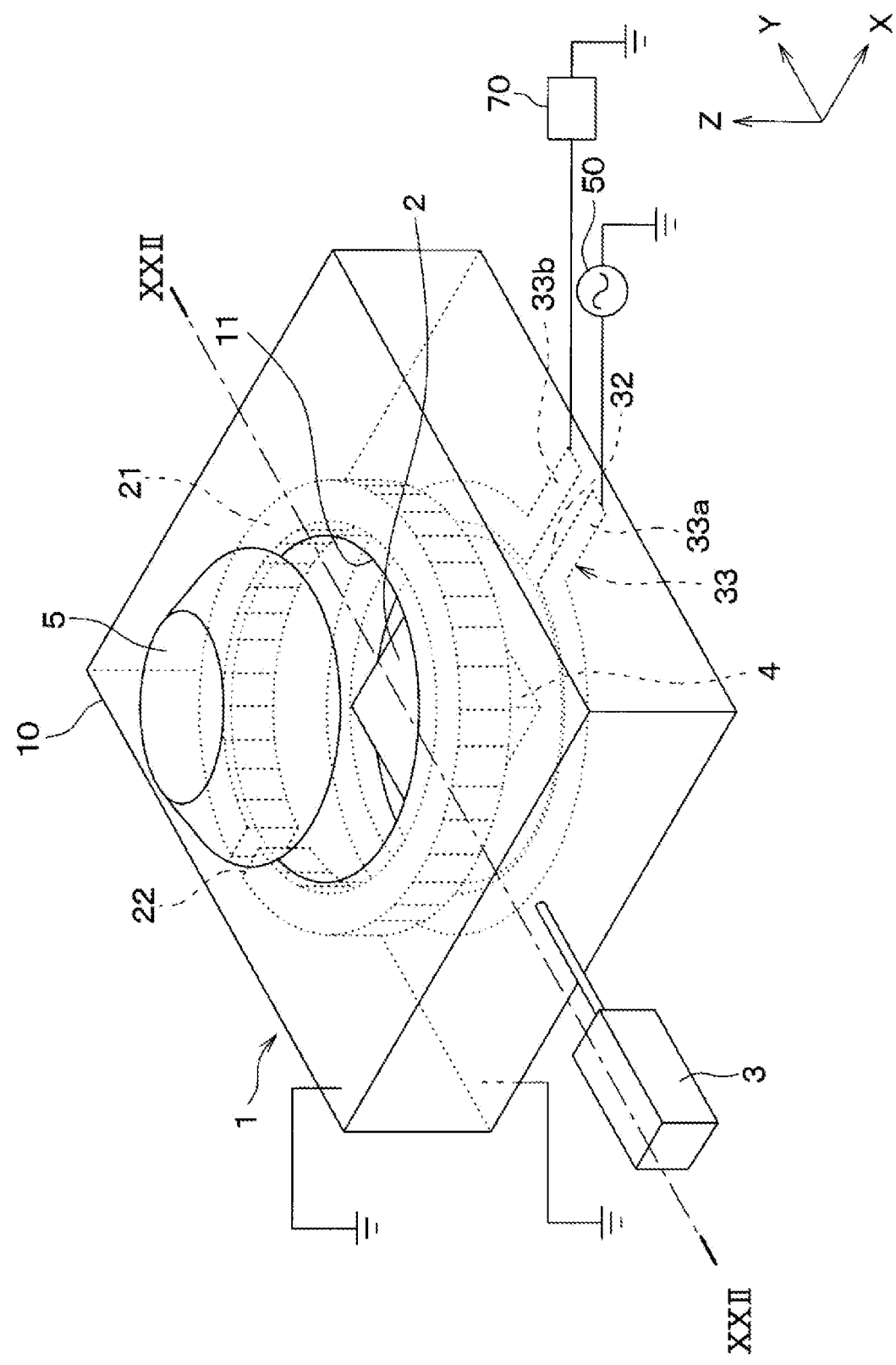
FIG. 21 is an overall configuration diagram of the magnetic sensor provided with the magnetic field generator according to a seventh embodiment.
Figure 22:
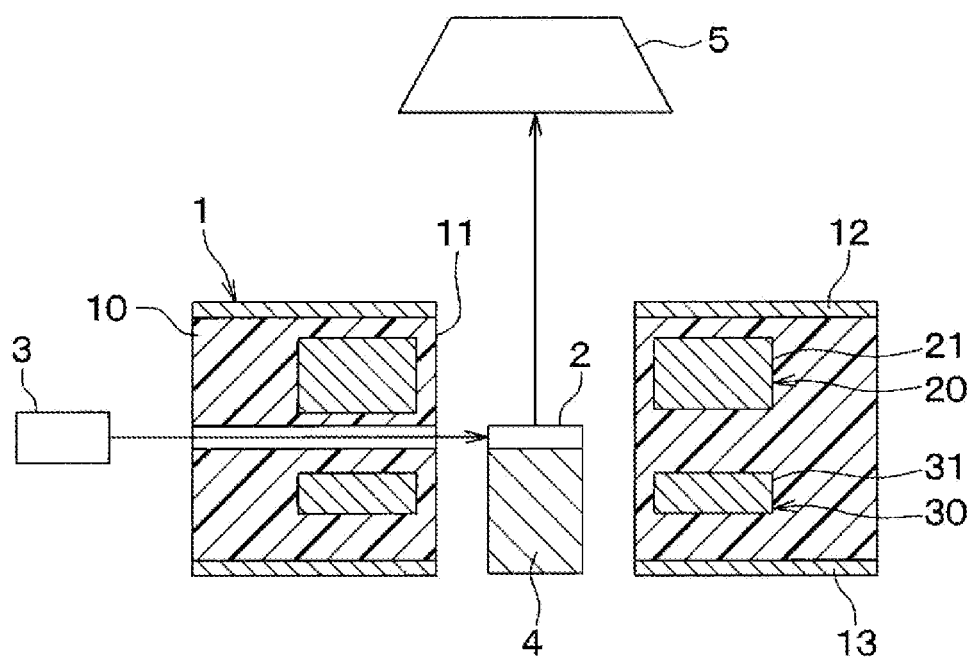
FIG. 22 is a cross-sectional view taken along a XXII-XXII line of FIG. 21.
Figure 23:
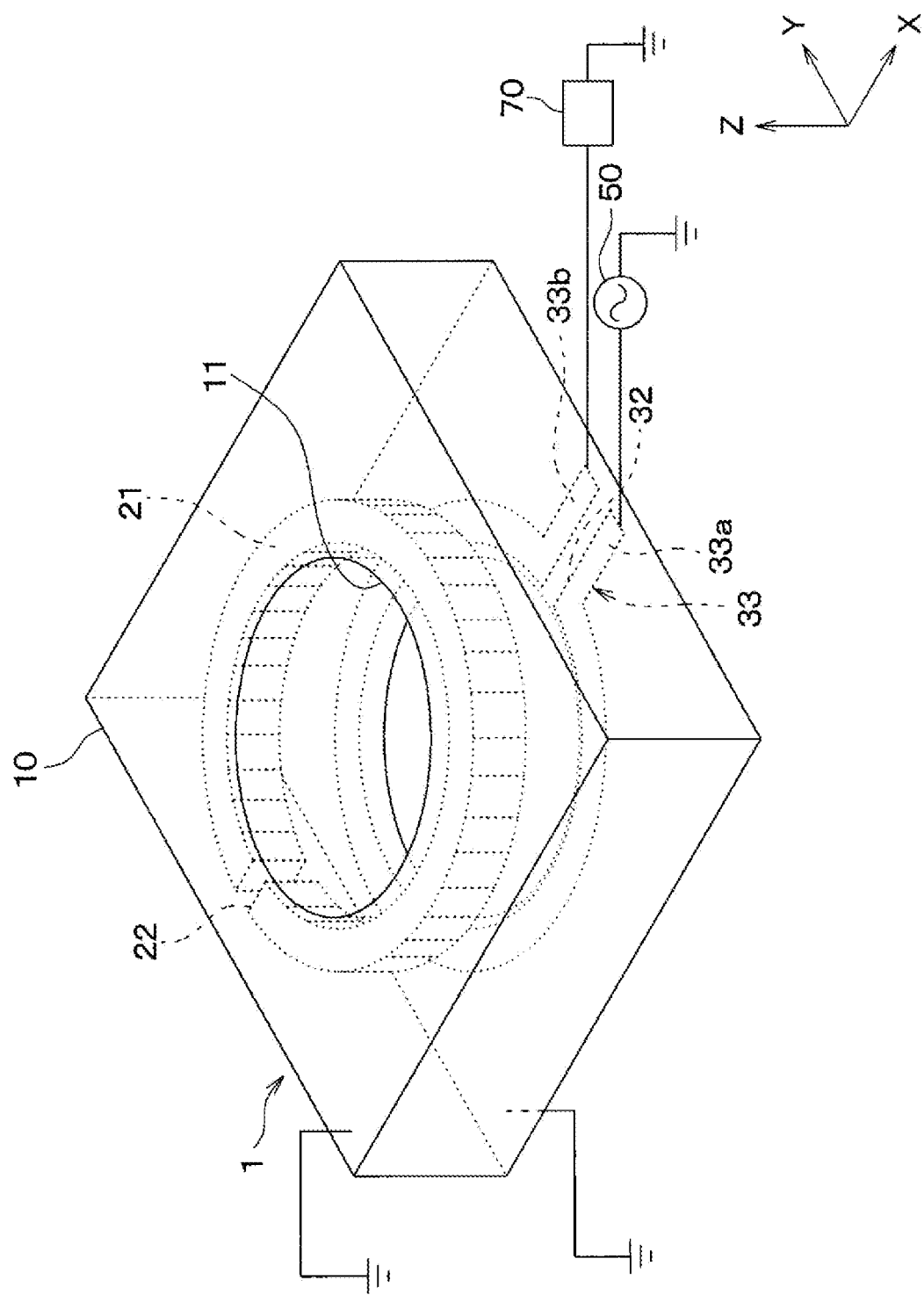
FIG. 23 is a diagram showing the magnetic field generator extracted from FIG. 21.

As shown in FIGS. 21, 22 and 23, the upper layer coil 20 is composed of only the coil portion 21 and the slit 22, and a high-frequency current is not supplied from the power source to the upper layer coil 20. Then, the high-frequency current is supplied from the power source 50 only to the lower layer coil 30. In such a configuration, when a high-frequency current is passed through the lower layer coil 30, the upper layer coil 20 is magnetically coupled or field-coupled to the lower layer coil 30, and the upper layer coil 20 functions as a resonance coil to generate LC resonance. Therefore, the resonance frequency of the upper layer coil 20 is adjusted to a frequency in which the length per loop of the coil portion 31 corresponds to one wavelength. That is, the frequency at which the electric length of the coil portion 31 becomes one wavelength is set as the resonance frequency.

The magnetic field generator 1 having such a configuration can also be used. In such a configuration, when a high-frequency current is passed through the lower layer coil 30, the electric currents of the upper layer coil 20 and the lower layer coil 30 at the same angle with respect to the coil central axis are controllable to flow in opposite directions from each other based on the LC resonance. Therefore, as in the first embodiment, a high-frequency magnetic field is generatable as to having the XY plane between the upper layer coil 20 and the lower layer coil 30 as the magnetic field direction. Thereby, the same effect as that of the first embodiment is achievable.

Although one slit 22 is formed in the upper layer coil 20, it is not necessary to form the slits 22, or a plurality of slits 22 may be formed. The number of slits 22 and the size of the gap may be appropriately set so that the resonance frequency based on the LC resonance matches the frequency in which the length per loop of the coil portion 21 is one wavelength.

Further, the present embodiment can also be applied to a configuration for generating a standing wave of a high-frequency current as in the fifth embodiment. In such case, the configuration may include the phase adjuster 90 that supplies high-frequency current from both ends of the coil portion 31 of the lower layer coil 30.

Further, the present embodiment can also be applied to the configuration of the sixth embodiment. In such case, since the high-frequency current is not directly supplied from the power source to the upper layer coil 20 which is the resonance coil, a structure provided with the input change switch 100 may be applied to the lower layer coil 30.

As a reference, with respect to the magnetic field generator 1 of the present embodiment, the current flow and the generated high-frequency magnetic field in the upper layer coil 20 and the lower layer coil 30 were investigated by simulation. The simulation results shown in FIGS. 24 and 25 were obtained.

Figure 24:
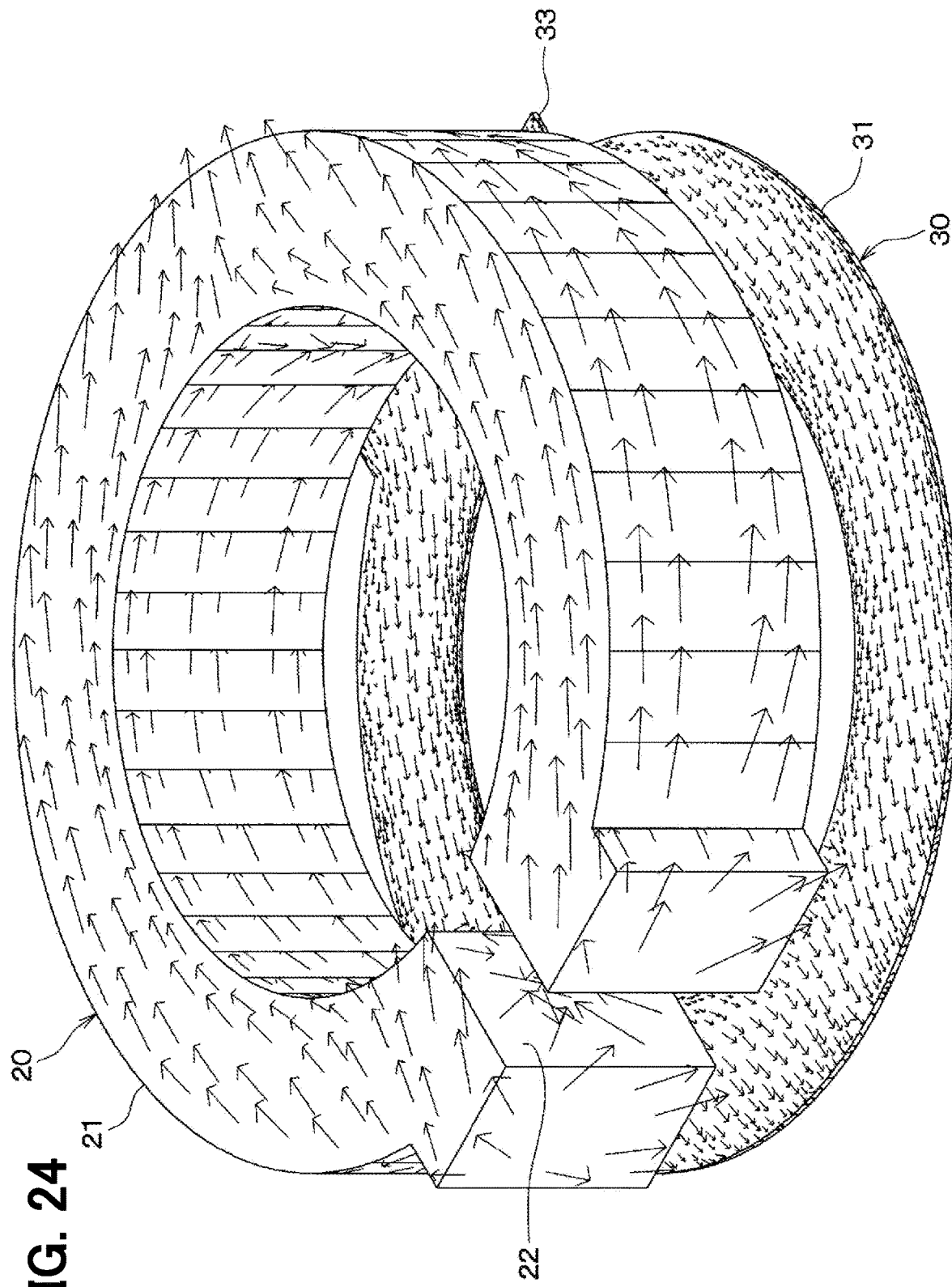
FIG. 24 is a diagram showing directions of electric currents flowing through the upper layer coil and the lower layer coil by simulation with arrows.

The direction of the electric current in various parts of the upper layer coil 20 and the lower layer coil 30 at an arbitrary timing when a high-frequency current is passed through the lower layer coil 30 is indicated by arrows in FIG. 24. That is, in the lower layer coil 30, the direction of the electric current is opposite at point-symmetric positions with respect to the coil central axis. Further, by passing a high-frequency current through the lower layer coil 30, a high-frequency current also flows through the upper layer coil 20, and the direction of the current is opposite even in the upper layer coil 20 at a position point-symmetric with respect to the coil central axis. Further, at the same angle position with respect to the coil central axis, the electric currents in the upper layer coil 20 and the lower layer coil 30 flow in opposite directions. Then, as shown in FIG. 24, the upper layer coil 20 is in a state where an electric current is generated from an arbitrary place on a slit 22 side, and the lower layer coil 30 is in a state where an electric current flows into an arbitrary place on a lead portion 33 side. Although the arrow indicating the direction of the electric current is shown to protrude from the upper layer coil 20 on one side of the upper layer coil 20 opposite to the slit 22 with respect to the coil central axis, the electric current actually flows from the upper end surface of the upper layer coil 20 to a side surface thereof, toward an upper-right corner of FIG. 24

Figure 25:
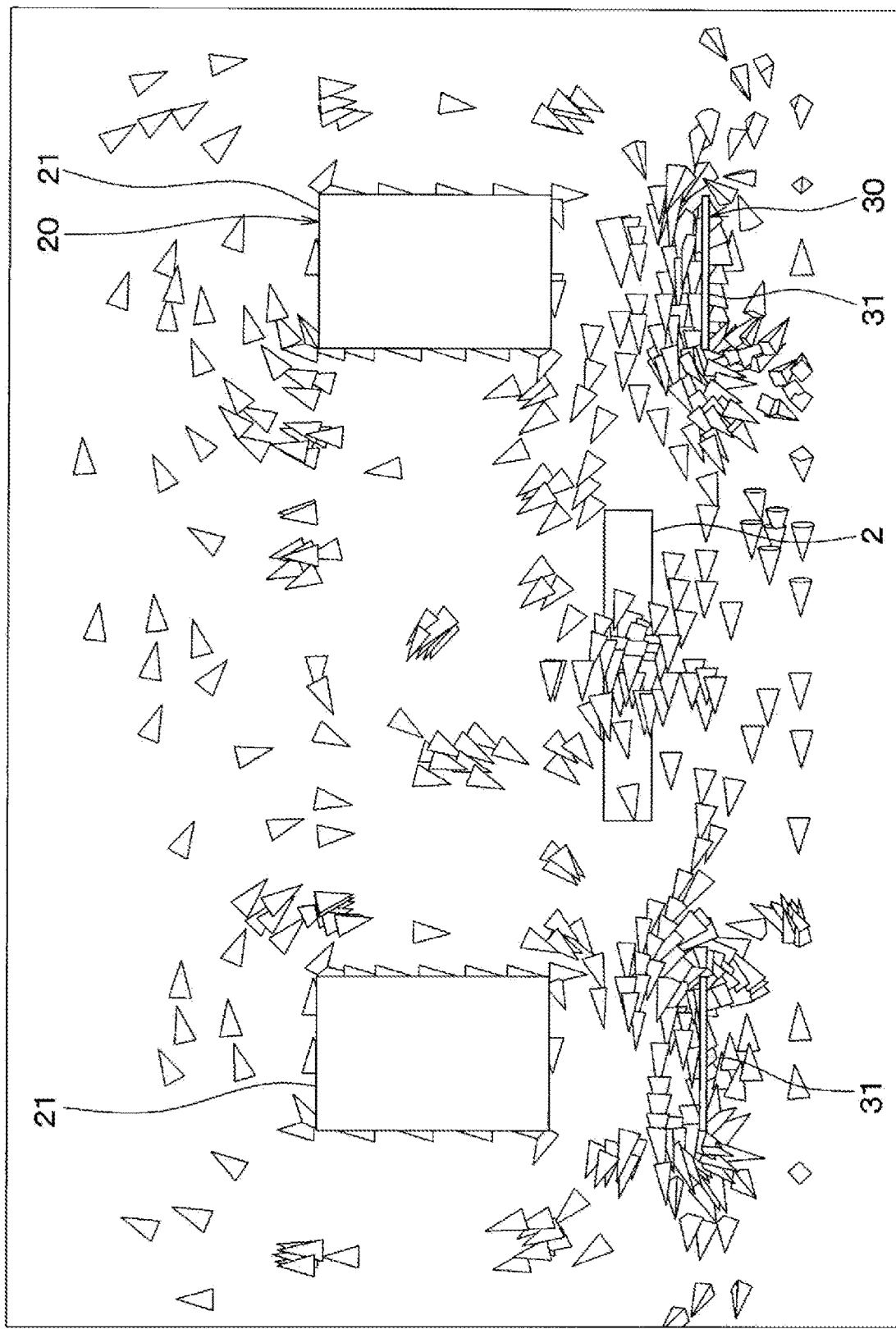
FIG. 25 is a diagram showing a simulation result of a high-frequency magnetic field generated by the magnetic field generator.

Therefore, in the cross section shown in FIG. 25, the upper layer coil 20 generates a clockwise magnetic field, and the lower layer coil 30 generates a counter-clockwise magnetic field. Therefore, as shown in FIG. 25, it can be seen that, (a) a high-frequency magnetic field can be generated in the left direction of the paper surface at the position of the diamond 2, and (b) a high-frequency magnetic field can be generated in the XY plane.

Other Embodiments

Although the present disclosure is described with reference to the embodiments described above, the present disclosure is not limited to such embodiments but may include various changes and modifications which are within equivalent ranges. In addition, various combinations and forms, as well as other combinations and forms including only one element, more than that, or less than that, are also within the scope and idea of the present disclosure.

For example, in each of the above embodiments, a structure in which the upper layer coil 20 and the lower layer coil 30 are provided in one substrate 10 and integrated is given as an example. However, this is only an example, and the substrate 10 may be divided into a plurality of sheets/layers, and may have a structure, in which an upper layer portion having the upper layer coil 20 and a lower layer portion having the lower layer coil 30 may separately be provided, and a dielectric film may be sandwiched therebetween. In such case, at least a portion of the substrate 10 between the upper layer coil 20 and the lower layer coil 30 may be made of/filled with a dielectric material.

Further, although a case where the upper layer coil 20 and the lower layer coil 30 are respectively provided with two layers has been described in the second embodiment, each of the coils 20, 30 may have only one layer or may have a plurality of layers, i.e., may have two or more layers. The number of layers of the upper layer coil 20 and the number of layers of the lower layer coil 30 may be the same or different. Further, even in a structure in which the upper layer coil 20 and the lower layer coil 30 have one layer or a plurality of layers, as described in the third embodiment, the slits and the lead portions may be arranged at different angles with respect to the coil central axis.

Further, in the fourth embodiment, a rectangular shape is given as one example of a case where the coil portion 21 of the upper layer coil 20 and the coil portion 31 of the lower layer coil 30 may have a polygonal shape. However, this is also only an example, and the shape of the coil portion may also be a quadrangle other than a rectangle, for example, a rhombus, or may also be a polygon other than a quadrangle such as a triangle or a pentagon. Of course, the circular/ring shape may also be an elliptical shape, or each corner of the polygonal shape may be rounded. In the first to third and fifth to seventh embodiments, since the coil portion 21 of the upper layer coil 20 and the coil portion 31 of the lower layer coil 30 are formed in an annular shape, the shape of the coil on the XY plane has the aspect ratio of vertical/horizontal dimensions as 1:1, when assuming that one direction of the XY plane is a vertical direction and another direction perpendicular to it is a horizontal direction. However, if the coil portion 21 and the coil portion 31 have an elliptical shape, the aspect ratios can be made different, and a strong high-frequency magnetic field can be generated in a direction along one side with a smaller aspect ratio. Of course, even when the coil portion 21 and the coil portion 31 have a polygonal shape other than a rectangle, a strong high-frequency magnetic field can be generated in a direction along one side with the smaller aspect ratio, i.e., by making the aspect ratio different from 1:1.

Further, in each of the above embodiments, the case where (a) the first conductive material constituting the upper layer coil 20 and the second conductive material constituting the lower layer coil 30 are copper and (b) the material of the substrate 10 is an epoxy-based resin material has been described as an example. However, such a configuration is only an example, and other materials may also be used. It may be preferable that the constituent materials of the upper layer coil 20 and the lower layer coil 30 are the same, but different constituent materials may also be used.

Further, in each of the above embodiments, the diamond 2 has been described as an example of the magnetic field measuring element, but an object other than the diamond 2 may also be used. Further, in each of the above embodiments, the case where the magnetic field generator 1 is applied to a magnetic sensor that receives a fluorescence by irradiating it with a laser beam has been described. However, it can also be applied to the method of (a) having an electric signal by irradiating a laser beam or (b) obtaining electrical output by inputting an electric signal. That is, it can be applied to PDMR (Photocurrent Detection Magnetic Resonance), EDMR (Electric Detection Magnetic Resonance) and the like.

In each of the above embodiments, the expressions "upper and lower" are used as the upper layer coil 20 and the lower layer coil 30, but it is only shown that the coils constituting the two loop circuits are overlapped and lined up at a predetermined distance, and it does not mean the direction of a top and bottom.

What is claimed is:

1. A magnetic field generator comprising:
   an upper layer coil composed of a first conductive material and forming a loop circuit having a coil portion;
   a lower layer coil composed of a second conductive material and forming a loop circuit having a coil portion arranged opposite to the coil portion of the upper layer coil at a predetermined distance;
   a substrate supporting the upper layer coil and the lower layer coil and having a dielectric material between the upper layer coil and the lower layer coil;
   a ground layer having a ground potential arranged to sandwich the upper layer coil and the lower layer coil on one surface and an other surface of the substrate;
   an upper layer power source that supplies a high-frequency current to the upper layer coil; and
   a lower layer power source that supplies a high-frequency current having a phase opposite to that of the high-frequency current supplied to the upper layer coil, wherein
   high-frequency currents of opposite phases are passed through the upper layer coil and the lower layer coil, respectively, and
   a length per loop of the coil portion in the upper layer coil and in the coil portion in the lower layer coil is matched to one wavelength of the high-frequency current.

2. The magnetic field generator of claim 1, wherein
   the coil portion of at least one of the upper layer coil and the lower layer coil is made of plural coils facing each other at a predetermined distance.

3. The magnetic field generator of claim 1, wherein
   a plane parallel to the coil portion of the upper and lower layer coils and positioned between the upper layer coil and the lower layer coil is designated as an XY plane with one direction called as a vertical direction and other direction called as a horizontal direction, and
   the coil portion of the upper layer coil or the lower layer coil has an aspect ratio of 1 regarding dimensions along a vertical and a horizontal dimension.

4. The magnetic field generator of claim 1, wherein
   a plane parallel to the coil portion of the upper and lower layer coils and positioned between the upper layer coil and the lower layer coil is designated as an XY plane with one direction called as a vertical direction and other direction called as a horizontal direction, and
   the coil portion of the upper layer coil or the lower layer coil has an aspect ratio of other than 1 regarding dimensions along a vertical and a horizontal dimension.

5. The magnetic field generator of claim 1, further comprising:
   a slit is formed in the coil portion of the upper layer coil, and the high-frequency current from the upper layer power source is supplied to one of both ends of the coil portion formed by the slit;
   a slit is formed in the coil portion of the lower layer coil, and the high-frequency current from the lower layer power source is supplied to one of both ends of the coil portion formed by the slit;
   an input change switch for switching the high-frequency current from the upper layer power source to flow to which of the both ends of the coil portion of the upper layer coil that receives a supply of the high-frequency current from the upper layer power source; and an input change switch for switching the high-frequency current from the lower layer power source to flow to which of the both ends of the coil portion of the lower layer coil that receives a supply of the high-frequency current from the lower layer power source.

6. The magnetic field generator of claim 1, further comprising:
a phase adjuster for generating a standing wave of the high-frequency current in the upper layer coil by supplying the high-frequency current from the upper layer power source to both ends of the coil portion formed by a slit; and
a phase adjuster for generating a standing wave of the high-frequency current in the lower layer coil by supplying the high-frequency current from the lower layer power source to both ends of the coil portion formed by a slit.

7. The magnetic field generator of claim 1, wherein
a slit is formed in the coil portion of the lower layer coil, and the high-frequency current from the power source is supplied to one of both ends of the coil portion formed by the slit, and
an input change switch is provided for switching which of the both ends of the coil portion of the lower layer coil that receives a supply of the high-frequency current from the power source.

8. The magnetic field generator of claim 1, wherein
a slit is formed in the coil portion of the lower layer coil, and
a phase adjuster is provided for generating a standing wave of the high-frequency current in the lower layer coil when supplying the high frequency current from the power source to both ends of the coil portion formed by the slit.

9. A magnetic sensor comprising:
a magnetic field generator including:
  an upper layer coil composed of a first conductive material and forming a loop circuit having a coil portion;
  a lower layer coil composed of a second conductive material and forming a loop circuit having a coil portion arranged opposite to the coil portion of the upper layer coil at a predetermined distance;
  a substrate supporting the upper layer coil and the lower layer coil and having a dielectric material between the upper layer coil and the lower layer coil;
  a ground layer having a ground potential and including
    (i) a top ground layer portion located on a top surface of the substrate, and
    (ii) a bottom ground layer portion located on a bottom surface of the substrate, such that the upper layer coil and the lower layer coil are sandwiched between the top ground layer portion and the bottom ground layer portion;
  an upper layer power source that supplies a high-frequency current to the upper layer coil; and
  a lower layer power source that supplies a high-frequency current having a phase opposite to that of the high-frequency current supplied to the upper layer coil, wherein
  high-frequency currents of opposite phases are passed through the upper layer coil and the lower layer coil, respectively, and
  a length per loop of the coil portion in the upper layer coil and in the coil portion in the lower layer coil is matched to one wavelength of the high-frequency current,
wherein
the substrate has a through hole piercing a front and a back surface thereof and passing through an inside of the coil portion of the upper layer coil and the lower layer coil, and
a magnetic field measuring element is arranged in the through hole and measures an external magnetic field, and
a light source irradiates the magnetic field measuring element with a light of specific wavelength.

10. The magnetic sensor of claim 9 further comprising:
a measurement unit provided in the magnetic field measuring element for receiving a wavelength-converted light out of the irradiated light.

11. The magnetic field generator of claim 9, wherein
a plane parallel to the coil portion of the upper and lower layer coils and positioned between the upper layer coil and the lower layer coil is designated as an XY plane with one direction called as a vertical direction and other direction called as a horizontal direction, and
the coil portion of the upper layer coil or the lower layer coil has an aspect ratio of 1 regarding dimensions along a vertical and a horizontal dimension.

12. The magnetic field generator of claim 9, wherein
a plane parallel to the coil portion of the upper and lower layer coils and positioned between the upper layer coil and the lower layer coil is designated as an XY plane with one direction called as a vertical direction and other direction called as a horizontal direction, and
the coil portion of the upper layer coil or the lower layer coil has an aspect ratio of other than 1 regarding dimensions along a vertical and a horizontal dimension.

13. A magnetic field generator comprising:
an upper layer coil composed of a first conductive material and forming a loop circuit having a coil portion;
a lower layer coil composed of a second conductive material and forming a loop circuit having a coil portion arranged opposite to the coil portion of the upper layer coil at a predetermined distance;
a substrate supporting the upper layer coil and the lower layer coil and having a dielectric material between the upper layer coil and the lower layer coil; and
a ground layer having a ground potential and including (i) a top ground layer portion located on a top surface of the substrate, and (ii) a bottom ground layer portion located on a bottom surface of the substrate, such that the upper layer coil and the lower layer coil are sandwiched between the top ground layer portion and the bottom ground layer portion, wherein
high-frequency currents of opposite phases are passed through the upper layer coil and the lower layer coil, respectively, and
a length per loop of the coil portion in the upper layer coil and in the coil portion in the lower layer coil is matched to one wavelength of the high-frequency current.

* * * * *